(12) United States Patent
Song et al.

(10) Patent No.: US 9,395,068 B2
(45) Date of Patent: Jul. 19, 2016

(54) FLEXIBLE LED LIGHT SOURCE PANEL, AND FLEXIBLE LED LIGHTING DEVICE FOR TAKING IMAGE BY USING THE SAME PANEL

(71) Applicant: Chang Hwan Song, Daegu (KR)

(72) Inventors: Chang Hwan Song, Daegu (KR); Sung Hwan Ryu, Gumi-si (KR)

(73) Assignee: Chang Hwan Song, Daegu (KR)

( * ) Notice: Subject to any disclaimer, the term of this patent is extended or adjusted under 35 U.S.C. 154(b) by 0 days.

(21) Appl. No.: 14/672,022

(22) Filed: Mar. 27, 2015

(65) Prior Publication Data

US 2015/0330610 A1  Nov. 19, 2015

(30) Foreign Application Priority Data

Apr. 4, 2014 (KR) .................. 10-2014-0040243
Apr. 25, 2014 (KR) .................. 10-2014-0050325

(51) Int. Cl.

| | |
|---|---|
| *F21V 19/00* | (2006.01) |
| *F21V 21/14* | (2006.01) |
| *F21V 5/00* | (2015.01) |
| *F21V 29/87* | (2015.01) |
| *F21S 2/00* | (2016.01) |
| *G03B 15/05* | (2006.01) |
| *F21V 25/12* | (2006.01) |
| *F21V 14/00* | (2006.01) |
| *F21V 23/00* | (2015.01) |
| *H01K 5/00* | (2006.01) |

(Continued)

(52) U.S. Cl.

CPC ............... *F21V 19/0035* (2013.01); *F21S 2/00* (2013.01); *F21V 5/006* (2013.01); *F21V 14/00* (2013.01); *F21V 19/003* (2013.01); *F21V 21/145* (2013.01); *F21V 23/008* (2013.01); *F21V 25/12* (2013.01); *F21V 29/87* (2015.01); *G03B 15/05* (2013.01); *H01K 5/00* (2013.01); *B82Y 30/00* (2013.01); *F21W 2131/406* (2013.01); *F21Y 2101/02* (2013.01); *F21Y 2105/001* (2013.01); *F21Y 2113/00* (2013.01); *Y10S 977/742* (2013.01)

(58) Field of Classification Search

CPC ...... F21V 19/0035; F21V 29/87; G03B 15/05
See application file for complete search history.

(56) References Cited

U.S. PATENT DOCUMENTS

| | | | | |
|---|---|---|---|---|
| 8,414,145 B2 * | 4/2013 | Mitsuishi | ........... | C09K 11/0883 313/502 |
| 8,546,824 B2 * | 10/2013 | Mitsuishi | ........... | C09K 11/0883 257/89 |

(Continued)

FOREIGN PATENT DOCUMENTS

| | | |
|---|---|---|
| KR | 20-0445498 | 7/2009 |
| KR | 10-2011-0067856 A | 6/2011 |

(Continued)

*Primary Examiner* — Elmito Breval
(74) *Attorney, Agent, or Firm* — Novick, Kim & Lee, PLLC; Jae Youn Kim

(57) ABSTRACT

Provided is a flexible LED light source panel including: a flexible LED module in which a plurality of LEDs is disposed in an array form on a flexible circuit board; a protective sheet stacked on the flexible LED module and diffusing light from the LEDs; a heat conduction sheet disposed under the flexible LED module; a heat radiation sheet disposed under the heat conduction sheet, made of fireproof fiber, and coated with a carbon nano tube molecule having a grid or vertical structure; and a light source guide having a quadrilateral shape.

21 Claims, 27 Drawing Sheets

(51) Int. Cl.
*F21Y 105/00* (2016.01)
*B82Y 30/00* (2011.01)
*F21W 131/406* (2006.01)
*F21Y 101/02* (2006.01)
*F21Y 113/00* (2016.01)

(56) References Cited

U.S. PATENT DOCUMENTS

| | | | | | |
|---|---|---|---|---|---|
| 2007/0217200 | A1* | 9/2007 | Yang | | H05K 1/0203 362/277 |
| 2007/0236626 | A1* | 10/2007 | Koganezawa | | G02B 6/0083 349/61 |
| 2011/0109834 | A1* | 5/2011 | Itoh | | G02B 6/0021 349/61 |
| 2011/0134161 | A1* | 6/2011 | Son | | G02B 6/0083 345/690 |
| 2011/0175119 | A1* | 7/2011 | Kim | | H01L 33/483 257/91 |
| 2012/0294042 | A1* | 11/2012 | Sung | | H01L 33/641 362/612 |
| 2014/0192529 | A1* | 7/2014 | Wilcox | | F21V 3/00 362/244 |

FOREIGN PATENT DOCUMENTS

KR   10-2012-0138378 A   12/2012
KR      10-1215658 B1   12/2012

\* cited by examiner

FLEXIBLE LED LIGHT SOURCE PANEL, AND FLEXIBLE LED LIGHTING DEVICE FOR TAKING IMAGE BY USING THE SAME PANEL

CROSS-REFERENCE TO RELATED APPLICATIONS

This U.S. non-provisional patent application claims priority under 35 U.S.C. §119 of Korean Patent Application Nos. 10-2014-0040243, filed on Apr. 4, 2014, and 10-2014-0050325, filed on Apr. 25, 2014, the entire contents of which are hereby incorporated by reference.

BACKGROUND OF THE INVENTION

The present invention disclosed herein relates to a flexible led light source panel, and a flexible LED lighting device for capturing an image by using the same panel. In particular, the present invention relates to a flexible led light source panel that is used for taking a picture and making broadcasting and a film, and a flexible LED lighting device for capturing an image by using the same panel.

In recent, a lighting device using an LED needs the feeling of color, such as cooler temperature or color rendering, unlike the past in which only the brightness of a light source has been pursued. In order to satisfy such a condition, the LED has developed to a level in which it is possible to satisfy high light efficiency, high color rendering, and accurate color temperature together. The lighting device using such an LED is replacing a general lighting device and being expanded to various LED application fields including e.g., a lighting device for making broadcasting or taking a picture.

Since such LED lighting has excellent performance such as less power consumption than halogen or metal lighting, has high efficiency and long lifespan, it has an advantage in which it is possible to satisfy a condition needed for lighting equipment for a special image.

However, a typical LED device for an image needs high power light for its characteristic, and in order to overcome such a limitation, the typical LED device further needs a heat radiation structure and thus there is a limitation in which the weight of a product increases. Thus, in order to implement an LED lighting device satisfying an optimal image taking condition, a structure enabling a decrease in weight and easy to move or store is needed.

In response to such a need, an LED lighting device for broadcasting having a flexible structure is disclosed in Korean Patent Application No. 10-2009-0068669. However, since a flexible structure disclosed in the application has a limitation in achieving high power lighting when a branch or line type LED light source module is applied or implemented, a separate heat radiation structure is needed in order to satisfy a characteristic as image lighting and thus there is a limitation in the mobility and storage capability of a product.

Also, when heat radiation fabric is used as the heat radiation structure in order to improve the mobility and storage of the product, special heat radiation processing is needed, and when general fabric is used, it is difficult to emit heat from the LED because a phenomenon that the fabric absorbs heat, and thus there is a limitation in that heat is accumulated in the fabric.

When a picture is taken or broadcasting or a film is made, lighting devices having various functions are being selectively used according to the purpose. For example, a lighting device for a picture uses a flash function, in which case a xenon lamp is being used as a light source for flash lighting.

Also, a lighting device for broadcasting or a film uses a continuous-light function, in which case halogen lighting having excellent color rendering is being mostly used as a light source for continuous-light lighting.

As such, since most of lighting devices for taking an image use high-power lighting, there is a need to separately purchase lighting devices satisfying heat emission, lifespan and special conditions, according to the use.

In recent, a lighting device using an LED that may replace these lighting devices is emerging, but as a configuration is provided to be suitable for various characteristics as described above and a heat radiation plate is provided in order to emit heat from a high-power LED, there is a limitation in that the weight of the product increases.

Also, there are limitations in that a continuous-light lighting device may not provide a flash effect and a diffused, continuous light lighting device generates shade when being used to produce focused light. Also, since the complexity and weight of a structure for applying various functions increase, there is a need for a lighting device that has a structure easy to carry, store and move.

SUMMARY OF THE INVENTION

An object of the present invention is to provide a flexible LED light source panel that enhances the mobility and storage of a lighting device and has an excellent heat radiation characteristic.

Another object of the present invention is to provide a flexible LED lighting device for taking an image that may provide various functions according to the use, decrease weight and enhance flexibility.

According to an embodiment of the present invention, there is provided a flexible LED light source panel including: a flexible LED module in which a plurality of LEDs is disposed in an array form on a flexible circuit board; a protective sheet stacked on the flexible LED module and diffusing light from the LEDs; a heat conduction sheet disposed under the flexible LED module; a heat radiation sheet disposed under the heat conduction sheet, made of fireproof fiber, and coated with a carbon nano tube molecule having a grid or vertical structure; and a light source guide having a quadrilateral shape.

The protective sheet may have a protrusion portion to correspond to a location and shape of the LED.

The flexible circuit board may have a heat radiation pad for transferring heat.

The flexible circuit board may have a circuit pattern to enable each of the LEDs to be connected to have a crossing structure.

The heat radiation sheet may include fiber obtained by adding flame retardant to polyester fiber, further include adhesive silicon obtained by mixing a carbon nano molecule in any one direction of the fireproof fiber, may be obtained by disposing the fireproof fiber in a two-stage structure, and an air path may be formed between the fireproof fibers.

A through hole may be formed at a portion of the flexible circuit board on which the LED is disposed, and the LED may be disposed on the through hole through heat conduction silicon.

According to an embodiment of the present invention, there is provided an image-taking-purpose flexible LED lighting device including: a flexible LED module obtained by alternately arranging a lens-attached LED and a lens-free LED on a flexible circuit board, a protective sheet stacked on the flexible LED module and diffusing light from the lens-attached LED and the lens-free LED, a heat conduction sheet disposed under the flexible LED module, a heat radiation sheet disposed under the heat conduction sheet and including fireproof fiber, and a flexible LED light source panel including a light source guide having a quadrilateral shape; and a control module enabling at least one of the lens-attached LED and the lens-free LED to selectively emit light according to any one of flash, focused continuous light, and diffused continuous light modes.

The flexible circuit board may have a heat radiation pad for transferring heat and has a through hole on a portion thereof on which the LED is disposed, and the LED may be disposed on the through hole through heat conduction silicon.

The flexible circuit board may have a circuit pattern to enable each of the LEDs to be connected to have a crossing structure.

The heat radiation sheet may include fiber obtained by adding flame retardant to polyester fiber, further include adhesive silicon obtained by mixing a carbon nano molecule in any one direction of the fireproof fiber, may be obtained by disposing the fireproof fiber in a two-stage structure, and an air path may be formed between the fireproof fibers.

The control module may enable the lens-attached LED to emit light according to the focused continuous light mode, enable the lens-free LED to emit light according to the diffused continuous light mode, and enable both the lens-attached LED and the lens-free LED to emit light according to the flash mode.

The control module may enable the flexible LED module to cooperate with a camera shutter according to the flash mode, enable the lens-free LED and the lens-attached LED to warm up to a state in which light is emitted with brightness equal or lower than about 10% of maximum brightness and then emit light, when there is an input signal from the camera shutter, and enable a light emission state to be maintained for a certain time after an operation of the shutter has been completed.

The lens-attached LED may be configured to have different divergence angles at the center and edge of the flexible circuit board.

The heat radiation sheet may be obtained by injecting of a carbon nano tube molecule having a grid or vertical structure onto a top surface of the sheet.

The control module may further include a communication unit communicating with an external device to be controlled remotely by the external device.

The external device may include mobile communication terminal, and the external device communicating with the communication unit may perform communication by using any one of communication standards including wireless WiFi, Bluetooth, and Zigbee.

The image-taking-purpose flexible LED lighting device may further include: a fixing plate attached to a rear surface of the flexible LED light source panel and having an insertion portion having a certain depth at each corner on a rear surface; a fixing support including: a rib having an X shape, a first fixing portion formed at each end of the rib and inserted and fixed into the insertion portion, and a second fixing portion formed to be pivotable about a side of the first fixing portion at each end of the rib, and disposed to protrude from each corner of the fixing plate; and a diffuse plate formed to cover a front surface of the flexible LED light source panel and disposed to be supported by the second fixing portion.

The rib may include spring steel or plastic having excellent elasticity.

The image-taking-purpose flexible LED lighting device may further include a fixing clip having a tongs shape and coupled to the rib.

The light source guide may include a variable wire in at least one of four sides.

The image-taking-purpose flexible LED lighting device may further include a soft box attached to the rear surface of the flexible LED light source panel through a speed ring.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 4A to 4C are equivalent circuits for explaining the operation of the flexible LED module, among which FIG. 4A is a normal, equivalent circuit, FIG. 4B is an equivalent circuit with LED short and FIG. 4C is an equivalent circuit with LED short;

FIGS. 6A to 6C represent an example of an image-taking-purpose LED lighting device using a flexible LED light source panel according to an embodiment of the present invention, among which FIG. 6A is a schematic diagram of the example, FIG. 6B is a coupled diagram of the example, and FIG. 6C is an exploded, perspective view of the example;

FIGS. 7A and 7B represent another example of an image-taking-purpose LED lighting device using a flexible LED light source panel according to an embodiment of the present invention, among which FIG. 7A is an example where a single flexible LED light source panel is included in a soft box, and FIG. 7B is a perspective view of an example where a plurality of flexible LED light source panels are included in the soft box;

FIGS. 15A and 15B represent another example of an image-taking-purpose flexible LED lighting device according to a still another embodiment of the present invention, among which FIG. 15A is an example where a plurality of flexible LED light source panels is included in a soft box, and FIG. 15B is a perspective view of an example where a single flexible LED light source panel is included in the soft box;

DETAILED DESCRIPTION OF PREFERRED EMBODIMENTS

Figure 1:
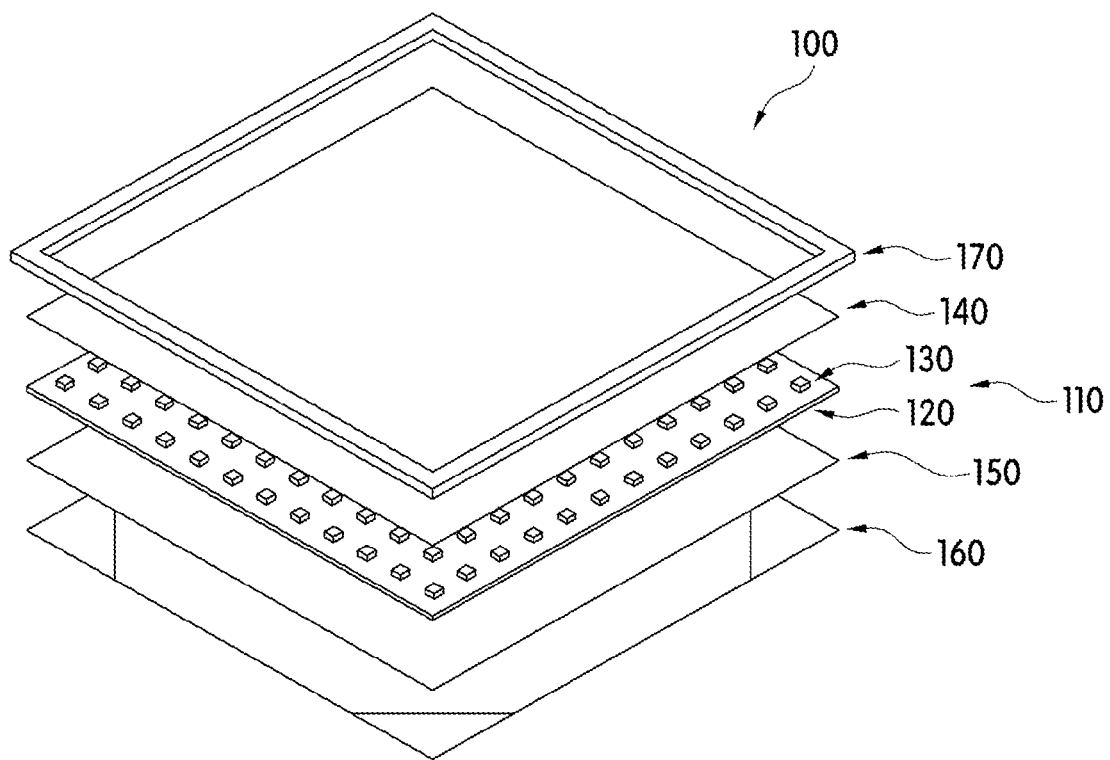
FIG. 1 is an exploded, perspective view of a flexible LED light source panel according to an embodiment of the present invention.

Embodiments of the present invention are described below in detail with reference to the accompanying drawings so that a person skilled in the art may easily practice the present invention. However, the present invention may be implemented in many different forms and is not limited to embodiments that are described herein. Content irrelevant to descriptions is omitted in order to clearly describe the present invention clear, and same or similar components have similar reference numerals throughout the disclosure.

Figure 2A:
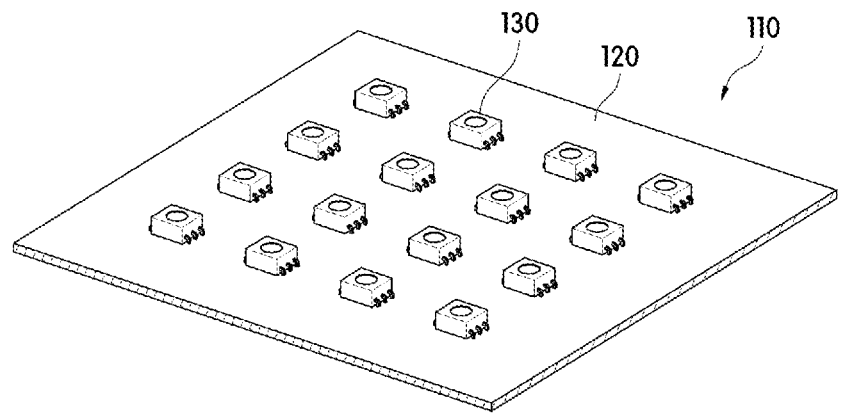
FIG. 2A is a partial, enlarged view of a flexible LED module of the flexible LED light source panel in FIG. 1.
Figure 2B:
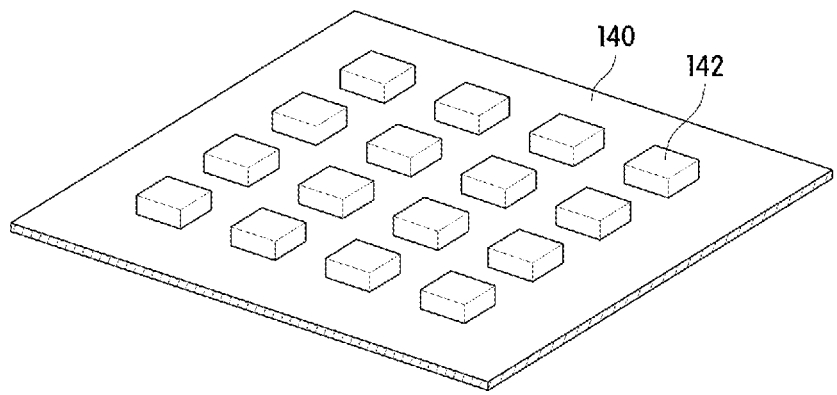
FIG. 2B is a partial, enlarged view of a protective sheet.
Figure 2C:
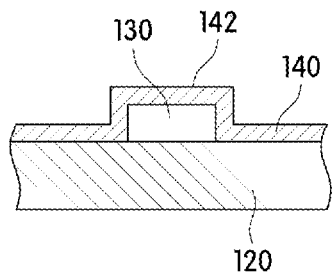
FIG. 2C is a cross-sectional view of when the LED module and the protective sheet are coupled.
Figure 3A:
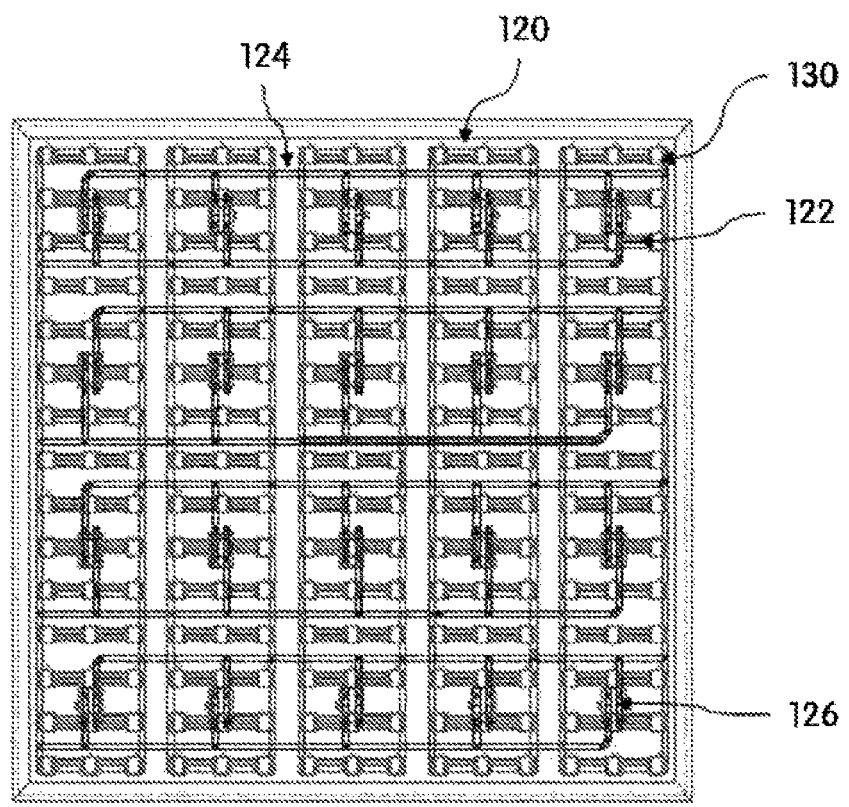
FIG. 3A is a wiring pattern diagram of the flexible circuit substrate of the flexible LED light source panel in FIG. 1.
Figure 3B:
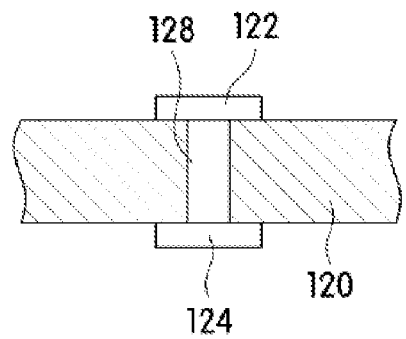
FIG. 3B is a connection structure of top and bottom surfaces and FIG. 3C is a cross-sectional view of the mounting structure of an LED.
Figure 3C:
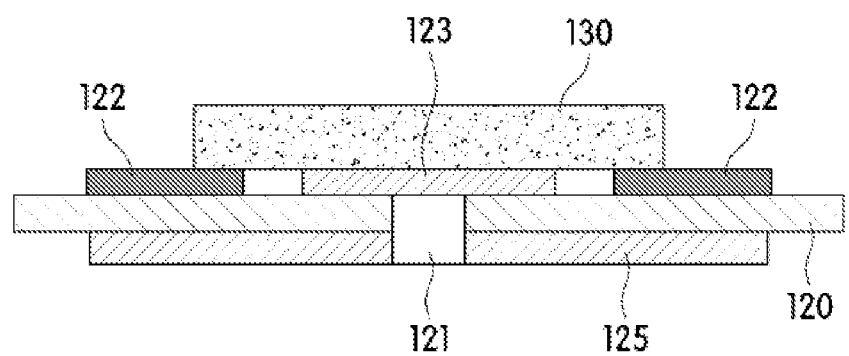
Figure 4A:
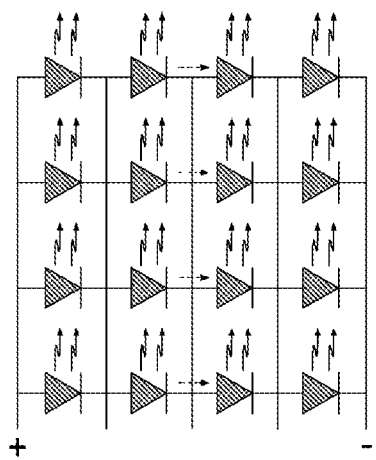
Figure 4B:
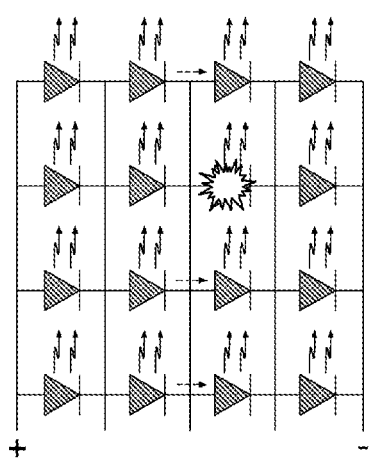
Figure 4C:
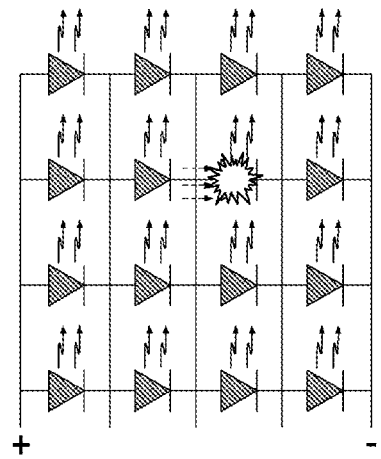
Figure 5A:
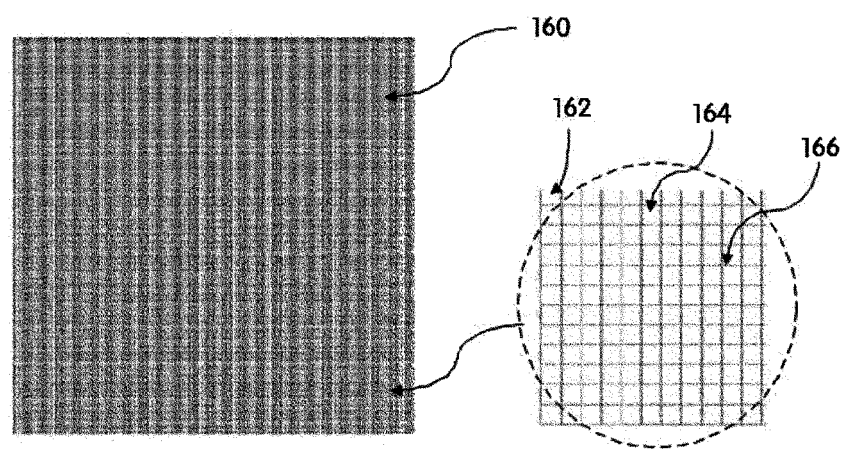
FIG. 5A is a diagram for explaining the structure of the heat radiation sheet in FIG. 1.
Figure 5B:
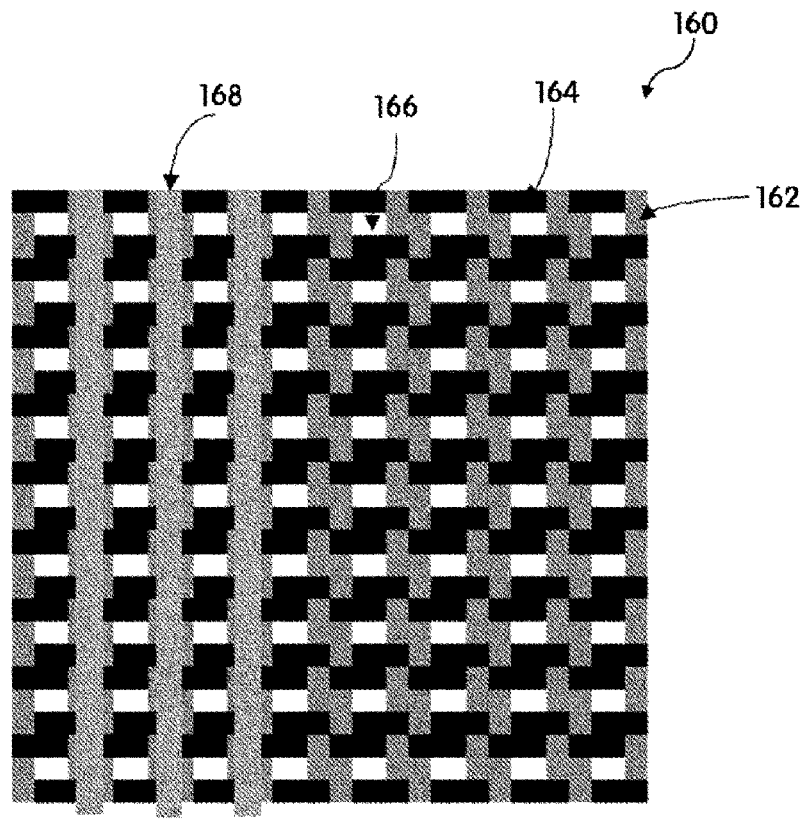
FIG. 5B is a partial enlarged view of the heat radiation sheet.
Figure 5C:
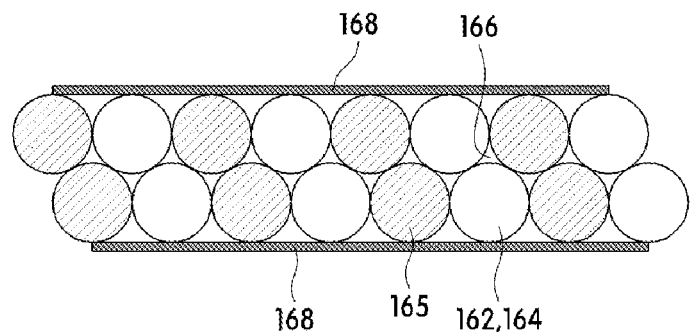
FIG. 5C is a cross-sectional view of the heat radiation sheet.

FIG. 1 is an exploded, perspective view of a flexible LED light source panel according to an embodiment of the present invention, FIG. 2A is a partial, enlarged view of a flexible LED module of the flexible LED light source panel in FIG. 1, FIG. 2B is a partial, enlarged view of a protective sheet, FIG. 2C is a cross-sectional view of when the LED module and the protective sheet are coupled, FIG. 3A is a wiring pattern diagram of the flexible circuit substrate of the flexible LED light source panel in FIG. 1, FIG. 3B is a connection structure of top and bottom surfaces, FIG. 3C is a cross-sectional view of the mounting structure of an LED, FIGS. 4A to 4C are equivalent circuits for explaining the operation of the flexible LED module, among which FIG. 4A is a normal, equivalent circuit, FIG. 4B is an equivalent circuit with LED short, FIG. 4C is an equivalent circuit with LED short, FIG. 5A is a diagram for explaining the structure of the heat radiation sheet in FIG. 1, FIG. 5B is a partial enlarged view of the heat radiation sheet, and FIG. 5C is a cross-sectional view of the heat radiation sheet. In the following, the flexible LED light source panel according to an embodiment of the present invention is described in more detail with reference to the drawings.

A flexible LED light source panel 100 includes a flexible LED module 110 formed by attaching an LED 130 onto a flexible circuit board 120, a protective sheet 140, a heat conduction sheet 150, a heat radiation sheet 160, and a light source guide 170, as shown in FIG. 1.

The flexible LED module 110 may be formed by disposing a plurality of LEDs 130 on the flexible circuit board 120 at regular intervals, i.e., in an array form, as shown in FIG. 2A. In this example, the LED 130 may be adhered with lead at about 280° C. in order to prevent the LED from becoming separated from the flexible circuit board 120 due to a flexible characteristic, and through holes for fixing to upper and lower parts may be formed in the pattern of the lead to which the LED 130 is attached.

The flexible circuit board 120 includes a double-side film substrate, which is to disperse heat generated from the LED 130, such as a copper foil. Also, a white solder mark may be formed on the film substrate, which may inhibit light emitted from the LED 130 from changing by the surface of the substrate.

A pattern 122 to which the LED 130 is attached is formed on the upper part of such a flexible circuit board 120 and heat radiation pads 124 and 126 transferring heat are formed on the lower part of the flexible circuit board. As shown in FIG. 3B, a through hole 128 may be formed in each part of the flexible circuit board 120 at which the LED 130 is disposed, in order to easily emit heat generated from the LED, and on the lower part of the flexible circuit substrate, a heat radiation pad may configure the circuit board in order to maximize a heat radiation area. In this example, the upper pattern 122 may be applied in a crossing structure, and the lower patterns 124 and 126 may provide a current spreading effect.

Such a flexible circuit board 120 may include the heat pad 122 so that LEDs 130 are disposed at about 10 mm to about 15 mm interval, but the present invention is not limited thereto and the LEDs may be disposed at intervals equal to or shorter than about 10 mm. Also, the flexible circuit board 120 may be implanted by coupling an LED 130 and another LED 130 in a crossing structure and thus even if an LED 130 is damaged, it is possible to prevent an adjacent LED 130 from becoming damaged together. That is, the disposition of the LEDs 130 may be configured by a single LED. For example, vertically connected cells may be configured to be connected by one line through a horizontal connection to adjacent cells. By such an LED 130 connection structure, it is possible to minimize the heat emission of the LED 130 and enhance a heat dispersion effect than when the LED 130 of each cell operates independently.

By the upper and lower patters 122, 124, and 126 of the flexible circuit board 120 as described above, the LED 130 circuit may be shown as shown in FIGS. 4A to 4C. That is, LEDs 130 may be connected in series or parallel. In this example, a configuration may be implemented to supply only about 70% of rated current for the current spreading of the LED 130.

In this case, when a specific LED is open due to fault as shown in FIG. 4B, 1/N of the rated current may be supplied to each line. Also, when a specific LED has a short as shown in FIG. 4C, currents intensively flow to a corresponding LED and thus over-current higher than the rated current is supplied thereto, and as a result, the corresponding LED may be damaged and thus open.

The heat radiation pad 122 is formed on a part of the flexible circuit board 120 on which the LED 130 is mounted, to surround the LED 130, thus heat generated from the LED 130 may be dispersed to a wide area. Such a heat radiation pad 122 may be connected to the upper heat radiation pad 122 and the lower heat radiation pad 124 through the through hole 128. In this example, the size of the through hole 128 may be about 0.2 mm or less in order that an external foreign material does not permeate. Also, the through hole 128 plays a role in discharging the air when heat fusion for manufacturing the flexible LED light source panel 100 is performed.

As shown in FIG. 3C, a through hole 121 communicating with a copper foil 125 formed on the bottom surface of the flexible circuit board 120 may be formed on a part of the flexible circuit board 120 on which the LED 130 is mounted, and the LED 130 may be mounted on the flexible circuit board 120 through heat conduction silicon 123. In this example, the through hole 121 plays a role in discharging the air when the flexible LED light source panel 100 is manufactured, in addition to the function of connecting the upper and lower patterns.

A power supply line (not shown) for supplying external power to the LED 130 may be installed on the lower part of the flexible circuit board 120, may be fixed to the flexible LED module 110 through fixing to the heat conduction sheet 150 or the heat radiation sheet 160.

The LED 130 needs to have high power equal to or higher about 1 W and a high color rendering index, a color rendering index may be 95 Ra or higher, and the deviation of color temperature may be ±100 K. These LEDs may include, as an LED fluorescent substance, a mixture of red and green fluorescent substances instead of a typical yellow fluorescent substance.

Referring back to FIG. 2, the protective sheet 140 may be stacked on the flexible LED module 110 to protect the LED 130 and diffuse light from the LED 130. Such a protective sheet 140 may include a silicon, polycarbonate or synthesis sheet in order to protect the board from water and prevent the LED 130 from being separated.

Such a protective sheet 140 may have an protrusion structure in order to increase the diffusivity of the LED 130 instead of linearity. That is, a protrusion portion 142 may be formed on the protective sheet 140 to correspond to the location and shape of the LED 130 disposed on the flexible circuit board 120, as shown in FIGS. 2B and 2C. Also, in order to increase the diffusivity of the LED 130 instead of linearity, the protective sheet 140 may include silicon containing a diffusive material.

Since such a protective sheet 140 may be bonded to the flexible LED module 110 by using vacuum compression, and prevent a foreign material from permeating the space between the protective sheet 140 and the flexible LED module 110. Also, the protective sheet 140 may be bonded to the flexible LED module 110 by heat fusion. The heat conduction sheet 150 may be disposed under the flexible LED module 110 in order to transfer heat generated from the LED 130 to the heat radiation sheet 160, so the adhesion and heat transfer between the flexible LED module 110 and the heat radiation sheet 160 may be easily performed. In this example, although the heat conduction sheet 150 may include a single sheet, the heat conduction sheet may include a plurality of small pieces, in which case pieces are disposed at about 10 mm intervals and may be attached onto the connection line between an LED 130 and another LED 130.

The heat radiation sheet 160 may be arranged under the heat conduction sheet 150, and provide a heat radiation function for emitting, heat transferred from the heat conduction sheet 150, to the outside.

Such a heat radiation sheet 160 may be metal fabric which includes a thin metal wire in order to increase heat conduction, or a heat radiation sheet having a surface coated with aluminum or copper. Also, the heat radiation sheet 160 may include carbon nano tube molecule instead of a metal material, for a decrease in weight.

Alternatively, the heat radiation sheet 160 may include fireproof fiber 162 and 164, e.g., fiber obtained by adding flame retardant to polyester fiber, and the upper part of the heat radiation sheet may be coated with carbon nano tube molecule to easily emit heat.

As shown in FIGS. 5A and 5B, the top surface of the heat radiation sheet 160 may be coated with carbon nano tube molecule having a grid (vertical and horizontal) or vertical structure. In this example, the fireproof fiber 162 and 165 coated with the carbon nano tube molecule and a heat conduction tape (or adhesive silicon) 168 may be respectively disposed vertically and horizontally to cross over each other.

The heat radiation sheet 160 includes a check pattern, and may also include a two-stage structure as shown in FIG. 5C. In this example, an air path 166 having e.g., about 0.5 mm size may be formed between the weaving structures 162, 164 and 165 forming the heat radiation sheet 160, in a series of zigzags. It is possible to easily move the air by increasing the contact area between the heat radiation sheet 160 and the air by such an air path 166, so it is possible to enhance heat radiation efficiency.

The light source guide 170 may be disposed at the edge of the flexible LED light source panel 100 and may include a rubber or synthetic resin based finishing material. Such a light source guide 170 may have e.g., a frame shape and may modularize the flexible LED light source panel 100. In this example, sheets configuring the flexible LED light source panel 100 may be coupled by heat fusion to have a single form, and the light source guide 170 may fix the perimeter of the flexible LED light source panel.

As such, the light source guide 170 may be in tight contact with the flexible LED light source panel 100, so it is possible to enhance waterproof and dustproof characteristics. Also, the light source guide 170 has a structure in which it is possible to attach a pocket or ring type hole or an adhesive sheet to four coroners for the attaching of a lighting device to a fixing frame.

In the following, the image-taking-purpose LED lighting device using the flexible LED light source panel according to the embodiment of the present invention is described with reference to FIGS. 6A to 7B.

Figure 6A:
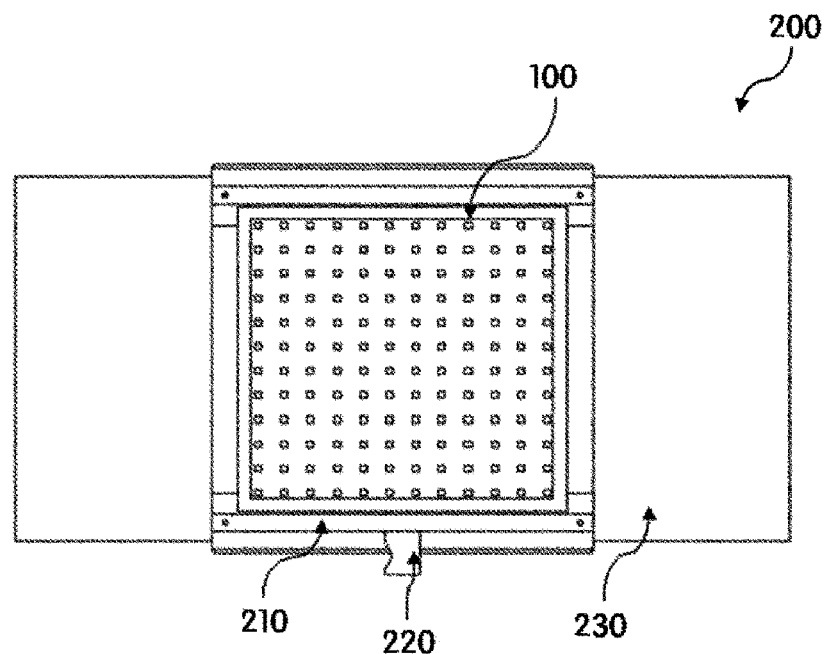
Figure 6B:
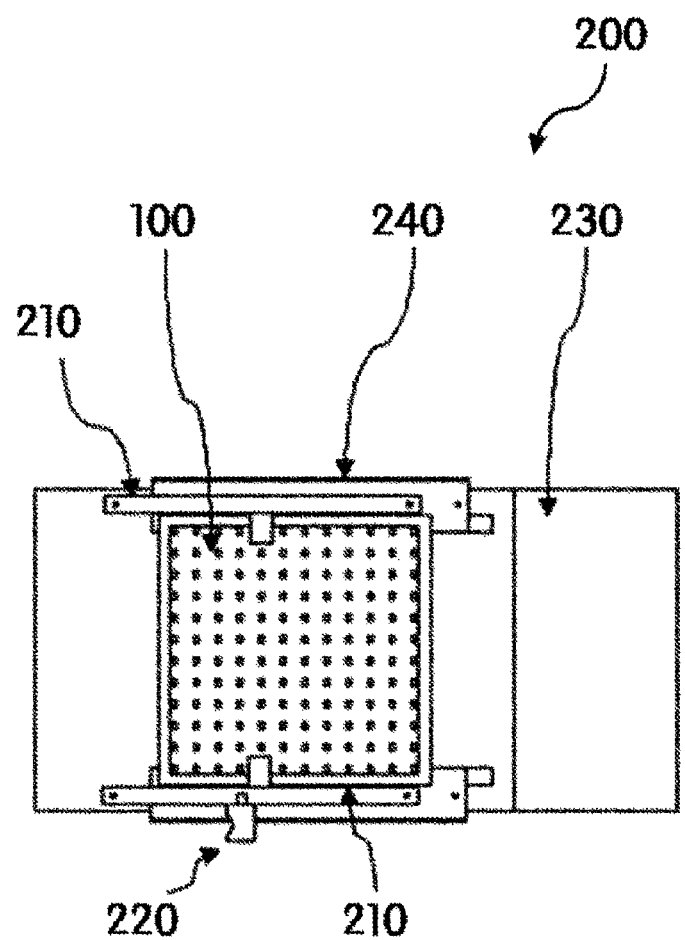
Figure 6C:
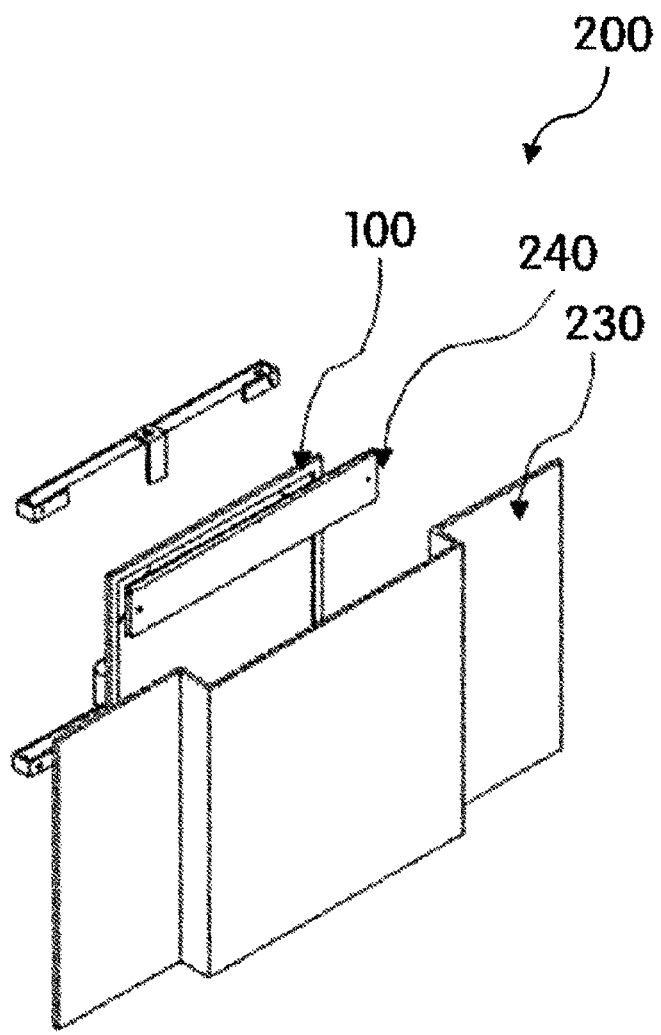
Figure 7A:
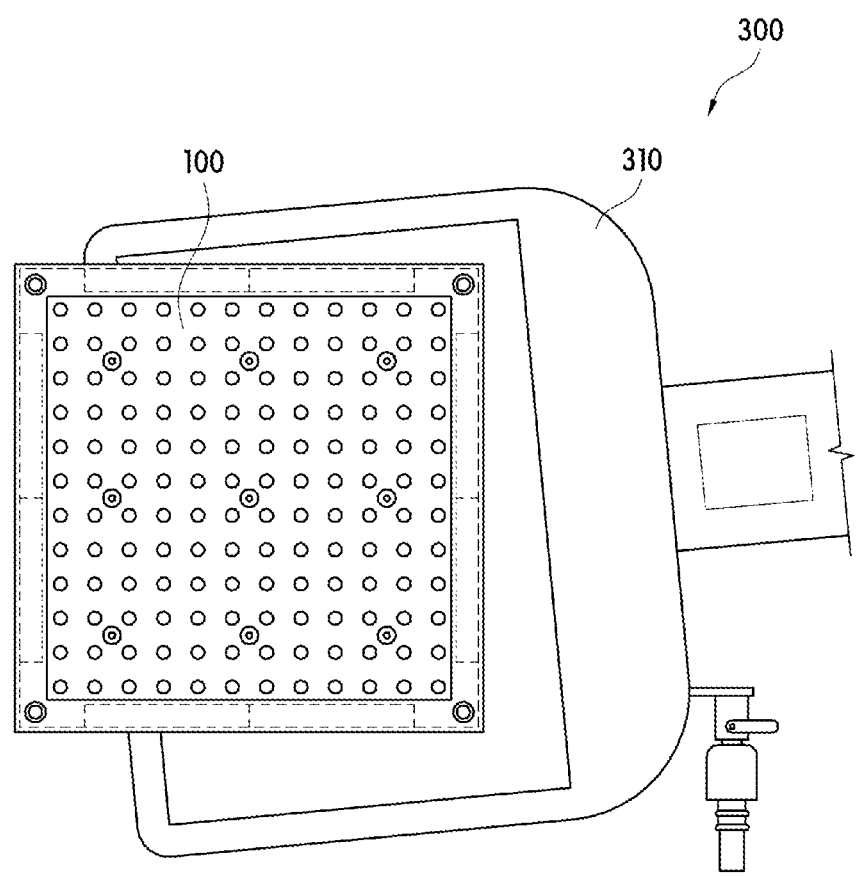
Figure 7B:
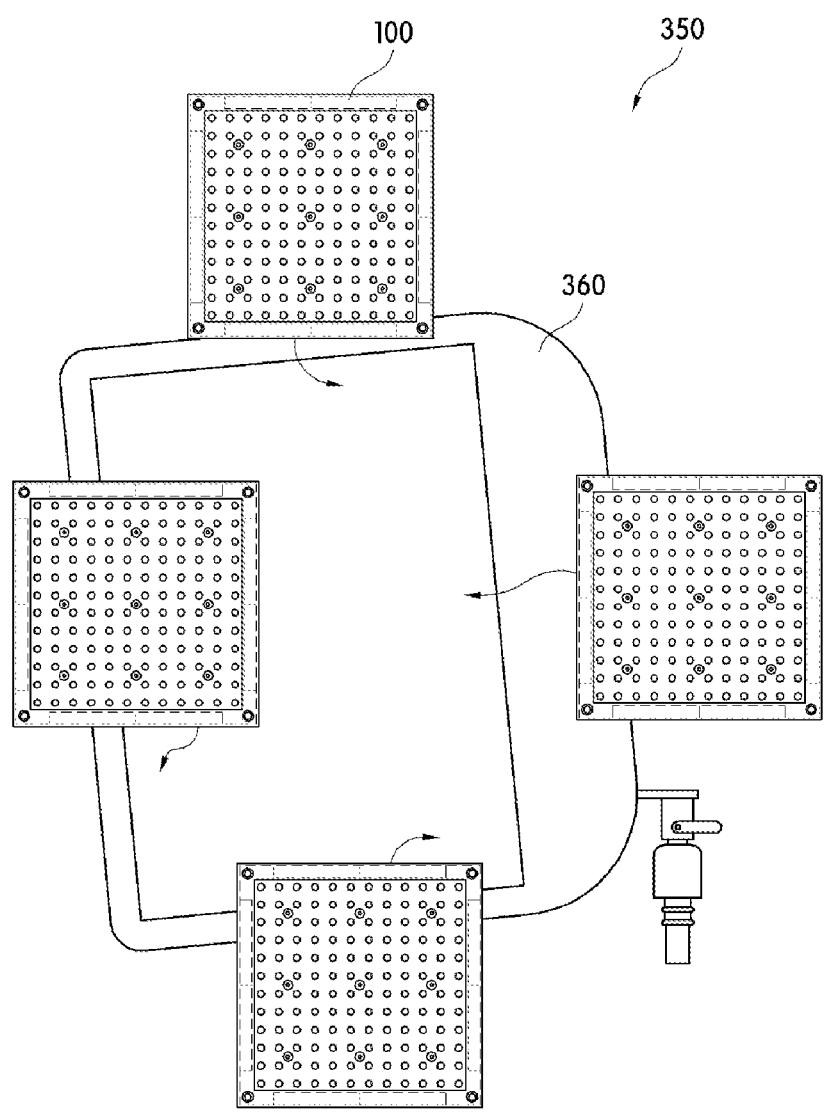

FIGS. 6A to 6C represent an example of an image-taking-purpose LED lighting device using a flexible LED light source panel according to an embodiment of the present invention, among which FIG. 6A is a schematic diagram of the example, FIG. 6B is a coupled diagram of the example, FIG. 6C is an exploded, perspective view of the example, FIGS. 7A and 7B represent another example of an image-taking-purpose LED lighting device using a flexible LED light source panel according to an embodiment of the present invention, among which FIG. 7A is an example where a single flexible LED light source panel is included in a soft box, and FIG. 7B is a perspective view of an example where a plurality of flexible LED light source panels are included in the soft box.

As shown in FIGS. 6A to 6C, the image-taking-purpose LED lighting device 200 using the flexible LED light source panel 100 includes the flexible LED light source panel 100, a diffusing filter guide 210, a stand holder 220, a fixing frame 230, and a fixing frame guide 240.

The image-taking-purpose LED lighting device 200 may have a light structure, as it uses the flexible LED light source panel 100.

The diffusing filter guide 210 may enable a diffusing filter to be attached.

The stand holder 220 is used for the coupling to a stand and may include e.g., P-male.

The fixing frame 230 is the casing of the flexible LED light source panel 100, and its center may have a height difference so that the flexible LED light source panel 100 is installed. Such a fixing frame 230 may be a frame including various materials, such as plastic as well as aluminum, because the LED light source panel 100 emits little heat. Also, in the case of a plastic frame, the inside of the fixing frame 230 may have a ring-type or spring-type frame, or adhesive sheet structure.

The fixing frame guide 240 guides so that the fixing frame 230 configured as the casing of the flexible LED light source panel 100 is not bent.

As shown in FIGS. 7A and 7B, other examples 300 and 350 of the image-taking-purpose LED light device show when the flexible LED light source panel 100 is attached to the inside of the soft boxes 310 and 360 of a lighting device used for taking a picture or making broadcasting. In this example, the soft boxes 310 and 360 may have a quadrilateral, hexagonal or octagonal shape, and a Velcro tape (not shown) for attaching the flexible LED light source panel 100 may be disposed inside the soft boxes. Alternatively, the rear surface of the flexible LED light source panel 100 may be attached to the soft boxes 310 and 360 through a speed ring (not shown).

For example, the image-taking-purpose LED lighting device 300 uses only a single flexible LED light source panel 100 and the single flexible LED light source panel 100 may be attached to only the internal center of the soft box 310, as shown in FIG. 7A.

Also, the image-taking-purpose LED lighting device 350 uses a plurality of flexible LED light source panels 100 and the single flexible LED light source panel 100 may be attached to each surface of the soft box 360, as shown in FIG. 7B.

As such, the number of the flexible LED light source panels 100 attached to the inside of the soft box 310 may be determined according to the sizes of the soft boxes 310 and 360 and the flexible LED light source panel 100.

Such image-taking-purpose LED lighting devices 300 and 350 may represent a high light amount with low power consumption, because both a stroboscope and the soft box may be sued as a light source.

As describe above, since the flexible LED light source panel 100 is attached to the soft boxes 310 and 360 and thus the soft box itself may be used as a light source, a separate lighting device may not need.

Also, the image-taking-purpose LED lighting devices 300 and 350 using the soft box may need diffusing fabric which is added to the soft boxes 300 and 350 in order to further diffuse light diverged from the flexible LED light source panel 100.

In the following, an image-taking-purpose flexible LED lighting device according to another embodiment of the present invention is described with reference to FIGS. 8 to 10B.

Figure 8:
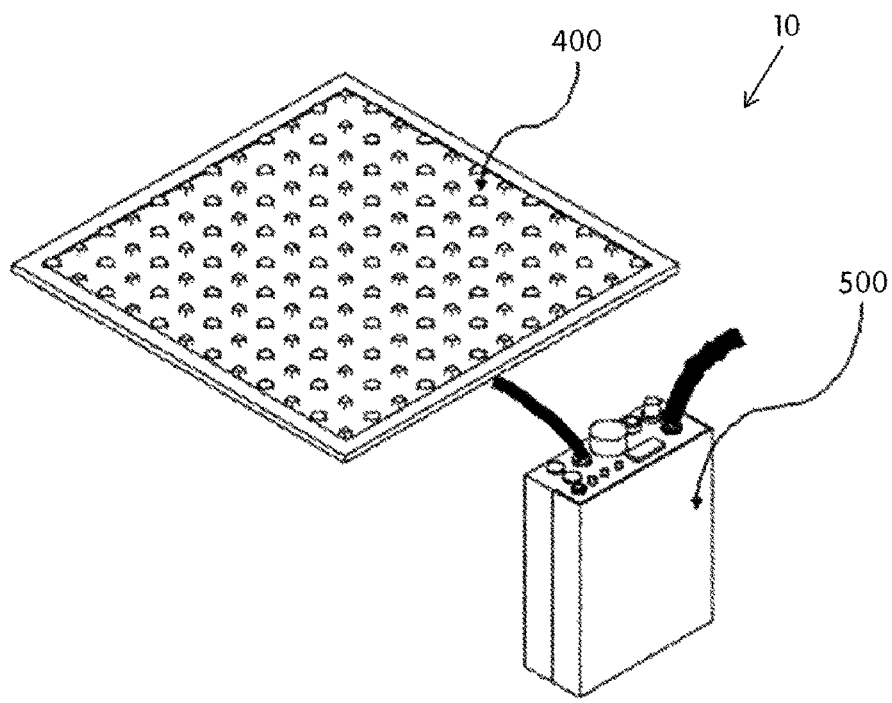
FIG. 8 is a schematic, perspective view of the general structure of an image-taking-purpose flexible LED lighting device according to another embodiment of the present invention.
Figure 9A:
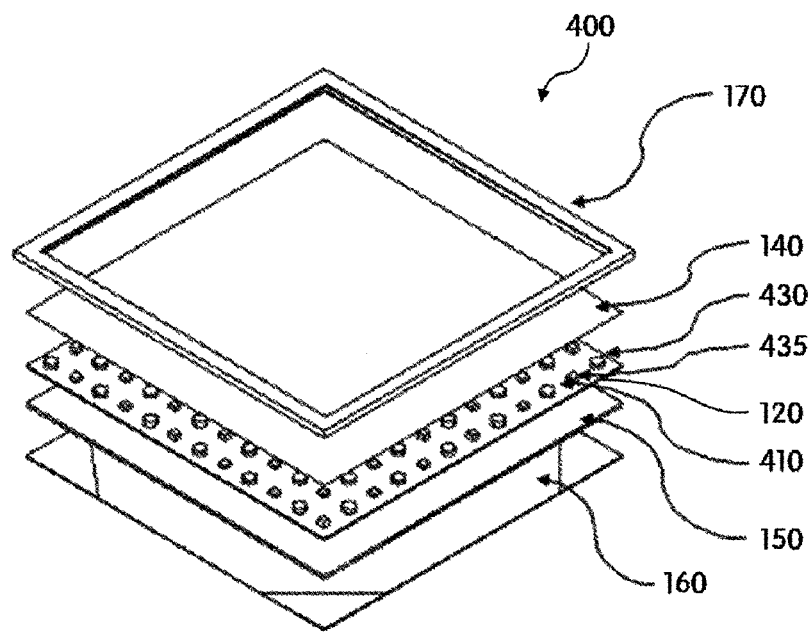
FIG. 9A is an exploded, perspective view of the detailed structure of the flexible LED light source panel in FIG. 8
Figure 9B:
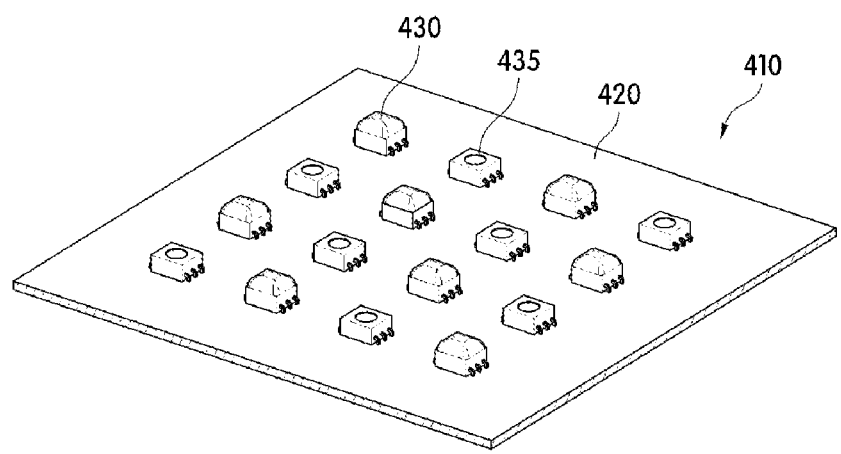
FIG. 9B is a partial enlarged view of the flexible LED module of the flexible LED light source panel.
Figure 10A:
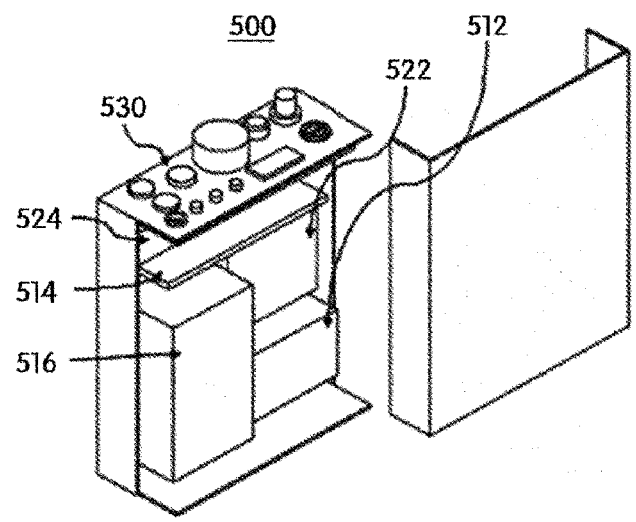
FIG. 10A is a perspective view of the detailed structure of a control module in FIG. 8
Figure 10B:
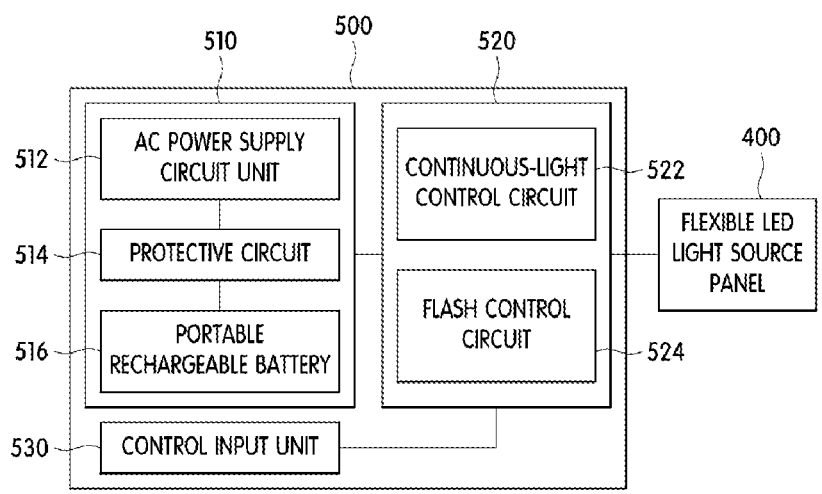
FIG. 10B is a block diagram of the detailed structure.

FIG. 8 is a schematic, perspective view of the general structure of an image-taking-purpose flexible LED lighting device according to another embodiment of the present invention, FIG. 9A is an exploded, perspective view of the detailed structure of the flexible LED light source panel in FIG. 8, FIG. 9B is a partial enlarged view of the flexible LED module of the flexible LED light source panel, FIG. 10A is a perspective view of the detailed structure of a control module in FIG. 8 and FIG. 10B is a block diagram of the detailed structure.

Referring to FIG. 8, an image-taking-purpose flexible LED lighting device 10 according to an embodiment of the present invention includes a flexible LED light source panel 400 and a control module 500.

The flexible LED light source panel 400 includes a flexible LED module 410 including a lens-attached LED 430 and a lens-free LED 435, a protective sheet 140, a heat conduction sheet 150, a heat radiation sheet 160, and a light source guide 170.

Since the flexible LED light source panel 400 has the same configuration as the flexible LED light source panel 100 as described with reference to FIGS. 1 to 5C except for the lens-attached LED 430, the detailed descriptions of components having the same reference numerals are omitted.

The flexible LED module 410 may be disposed on the flexible circuit board 120, and the lens-attached LED 430 and the lens-free LED 435 are alternately disposed. In this example, the lens-attached LED 430 is formed by attaching a lens to the LED and operates in a focused, continuous light mode or in a flash mode, and the lens-free LED 435 is an LED having no lens and may operate in a diffused, continuous light mode or in a flash mode.

In particular, the lens-attached LED 430 may be configured to have different divergence angles at the center and edges of the flexible circuit board 120 in order to enhance light-focusing performance when the lens-attached LED operates in the focused, continuous light mode. For example, the lens-attached LED 430 may be configured to diverge diverged light toward the center when the it is located at the edge of the flexible circuit board 120 so that the divergence angle is focused on the center, as will be described. To this end, it is possible to adjust the divergence angle of the lens attached to the LED. Alternatively, when the same lens-attached LED 430 is used, it is possible to adjust the divergence angle so that the edge of the flexible circuit board 120 faces the center. Also, the lens-attached LED 430 may be formed by integrally attaching the lens or by using a lens capable of being attached or detached according to a usage condition.

Since the lens-attached LED 430 and the lens-free LED 435 have the same configuration as the LED 130 described with reference to FIGS. 1 to 5C, their detailed descriptions are omitted.

The control module 500 may enable any one of the lens-attached LED 430 and the lens-free LED 435 to selectively emit light according to any one of a flash mode, a focused, continuous light mode and a diffused, continuous mode.

For example, the control module 500 may enable the lens-attached LED 430 to emit light in order to operate in the focused, continuous light mode, enable the lens-free LED 435 to emit light in order to operate in the diffused, continuous light mode, and enable both the lens-attached LED 430 and the lens-free LED 435 to emit light in order to operate in the flash mode.

In particular, when an operation is performed in the flash mode, the control module 500 may enable the flexible LED light source panel 400 to cooperate with the shutter of a camera (not shown). In this case, when the shutter signal of the camera is input, the control module 500 may enable the lens-attached LED 430 and the lens-free LED 435 to warm up to a state in which light is emitted with brightness equal to or lower than about 10% of their maximum brightness, and emit light with high power in the flash mode after the warm up operation. Also, the control module 500 may maintain a high-power light emission state for a certain time after the shutter operation of the camera has been completed, and enable the camera to be turned off after a transition to the warm up state as described above.

The control module 500 includes a power supply unit 510, an operation mode control unit 520, and a control input unit, as shown in FIGS. 10A and 10B.

The power supply unit 110 receives external power, performs power supply to the control module 500 and charging thereon and includes an AC power supply circuit unit 512, a protective circuit 514, and a portable rechargeable battery 516.

The control module may include the AC power supply circuit unit 512, a continuous-light control circuit 522, the portable rechargeable battery 516, the protective circuit 514, a flash control circuit 524, and a control input unit 530.

The AC power supply circuit unit 512 may receive external power and convert it into a voltage suitable for each component of the control unit 500.

The protective circuit 514 may interrupt an overvoltage and an overcurrent higher than a current set in flash operation in order to protect the flash control circuit 524 using high power from the AC power supply circuit 512 or the portable rechargeable battery 516. Also, the protective circuit 514 may include a reverse-current protection diode for protecting a reverse current from flowing from the AC power supply circuit unit 512 to the portable rechargeable battery 516.

The portable rechargeable battery 516 may be charged by power supplied from the AC power supply circuit unit 512, supply power to the control module 500, and include e.g., a lithium ion battery or lead storage battery.

The operation mode control unit 520 may control the operation mode of the flexible LED light source panel 400 connected to the control module 500 and include the continuous-light control circuit 522 and the flash control circuit 524.

The continuous-light control circuit 522 may include a constant-current circuit having maximum power being about 50% of the maximum output power of the lens-attached LED 430 or lens-free LED 435, and supply a current to the lens-attached LED 430 or lens-free LED 435 according to an operation mode, i.e., according to focused, continuous light mode or diffused, continuous mode.

The flash control circuit 524 momentarily supplies a high current to the lens-attached LED 430 and the lens-free LED 435 and is configured so that a high current supplied to each LED does not exceed the maximum power of the lens-attached LED 430 and the lens-free LED 435. In this case, since the current supplied to an LED operates in the form of an instant pulse wave, the flash control circuit 524 enable enables the lens-attached LED 430 and the lens-free LED 435 to initially maintain brightness corresponding to about 10% of their maximum power and thus the image-taking-purpose flexible LED lighting device 10 may be used as reference lighting that may have a warm-up function for protecting the LED from becoming damaged when an instant high current is input, and check the shape of a subject.

The control input unit 530 is disposed external to the control module 500, and may include the selection switch of the operation mode of the image-taking-purpose flexible LED lighting device 10, e.g., focused continuous light, diffused continuous light and flash modes.

Figure 11A:
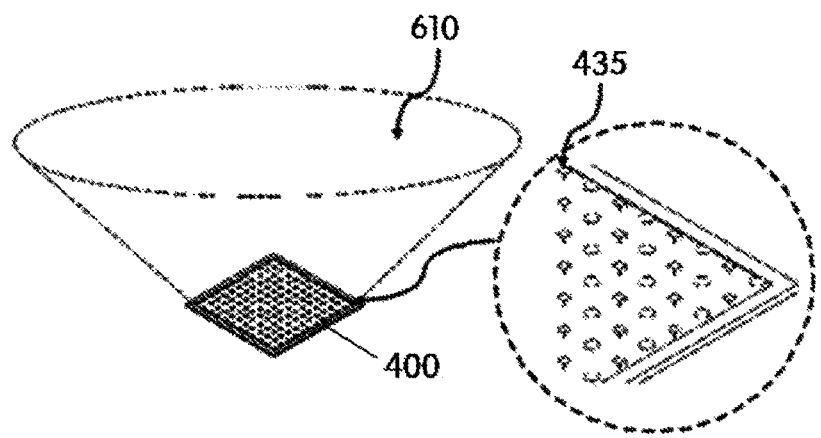
FIG. 11A is a diagram for explaining the diffused, continuous light mode of an image-taking-purpose flexible LED lighting device according to another embodiment of the present invention.

In the following, the operation mode of the image-taking-purpose flexible LED lighting device according to another embodiment of the present invention is described in more detail with reference to FIGS. 11A to 11C. FIG. 11A is a diagram for explaining the diffused, continuous light mode of an image-taking-purpose flexible LED lighting device according to another embodiment of the present invention, FIG. 11B is a diagram for explaining the focused, continuous light mode of the device, and FIG. 11C is a diagram for explaining the flash mode of the device.

As shown in FIG. 11A, only the lens-free LED 435 may emit light from the flexible LED light source panel 400 when the image-taking-purpose flexible LED lighting device 10 operates in the diffused, continuous light mode. In this case, the maximum power of the lens-free LED 435 may be e.g., about 160 W but use higher or lower power according to the size of the image-taking-purpose flexible LED lighting device 10. Although the present embodiment may be implemented to have, as the maximum brightness of the lens-free LED 435, brightness corresponding to about 30% to about 40% of the maximum power of the lens-free LED 435 in consideration of heat radiation in order to operate in the diffused, continuous light mode, the present invention is not limited thereto and the maximum brightness may be adjusted according to use or the size of the image-taking-purpose flexible LED lighting device 10. In this case, a divergence angle by the image-taking-purpose flexible LED lighting device 10 may be configured to be a divergence angle 312 of up to about 120 degrees when the flexible LED light source panel 400 is maintained in a flat state, but it is possible to adjust the divergence angle to up to about 360 degrees according to the usage angle of the flexible LED light source panel 400. In this case, the brightness of the lens-free LED 435 may controlled by about 0% to about 100% by an external brightness control method and color temperature may be configured to be about 3200 K or about 5600K having an error of about 100 K.

Figure 11B:
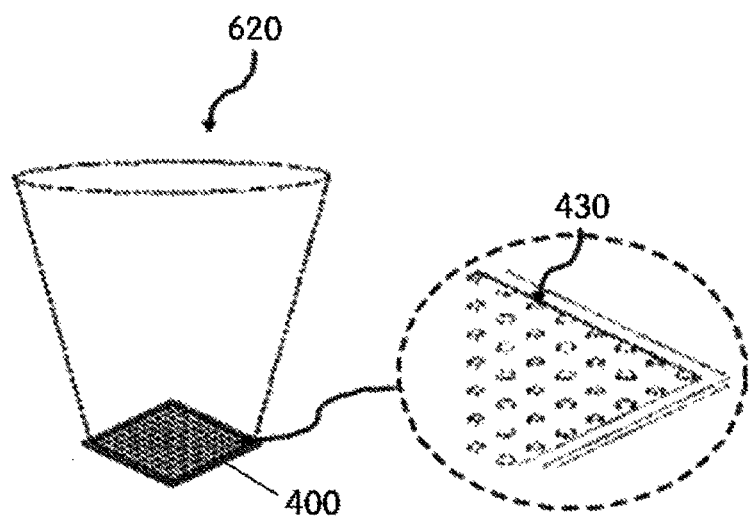
FIG. 11B is a diagram for explaining the focused, continuous light mode of the device.
Figure 11C:
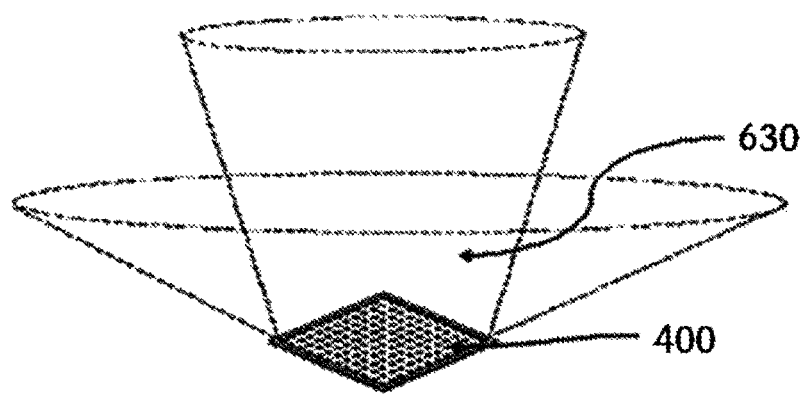
FIG. 11C is a diagram for explaining the flash mode of the device.

As shown in FIG. 11B, only the lens-attached LED 430 may emit light from the flexible LED light source panel 400 when the image-taking-purpose flexible LED lighting device 10 operates in the focused, continuous light mode. In this case, in order to focus the divergence angle of the flexible LED light source panel 400 on the center unlike the diffused, continuous light mode, modified lenses are used so that the divergence angle of the LED disposed at the edge of the flexible LED module 410 is different from that of the LED disposed at the center, in which case the modified lenses are formed so that the divergence angle of the LED becomes the center at the edge or center, for example. Alternatively, when LEDs having the same lens are used for the flexible LED module 410, the divergence angle of the flexible LED light source panel 400 is modified, e.g., the edge of the flexible LED light source panel 400 is bent toward the center to be capable of achieving focused, continuous light. In this case, it is possible to make a light source plane flat by attaching a flat plastic or aluminum plate to the bottom surface of the flexible LED light source panel 400.

The lens-attached LED 430 in the present embodiment may be about 160 W like the lens-free LED 435, but it is possible to use higher or lower power according to the size of the image-taking-purpose flexible LED lighting device 10. Although the present embodiment may be implemented to have, as the maximum brightness of the lens-attached LED 430, brightness corresponding to about 30% to about 40% of the maximum power of the lens-attached LED 430 in consideration of heat radiation in order to operate in the focused, continuous light mode, the present invention is not limited thereto and the maximum brightness may be adjusted according to use and the size of the image-taking-purpose flexible LED lighting device 10. In this case, a divergence angle by the image-taking-purpose flexible LED lighting device 10 may be configured to be a divergence angle 322 of up to about 50 degrees when the flexible LED light source panel 400 is maintained in a flat state, but it is possible to adjust the divergence angle to up to about 10 degrees according to the usage angle of the flexible LED light source panel 400. In this case, the brightness of the lens-attached LED 430 may controlled by about 0% to about 100% by an external brightness control method and color temperature may be configured to be about 3200 K or about 5600K having an error of about 100 K.

As such, in the focused or diffused continuous light mode, it is possible to adjust the divergence angle in each mode according to the selection of a lens, the usage angle of the flexible LED light source panel 400, e.g., the bent angle of the edge of the flexible LED light source panel 400.

As shown in FIG. 11C, both the lens-attached LED 430 and the lens-free LED 435 may emit light from the flexible LED light source panel 400 when the image-taking-purpose flexible LED lighting device 10 operates in the flash mode. In this case, in order to operate in the flash mode, the flexible LED light source panel 400 including the lens-attached LED 430 and the lens-free LED 435 may adjust the brightness of the lens-attached LED 430 and the lens-free LED 435 to about 10% of their maximum brightness to be capable of viewing the shape of a subject before a flash function is performed. Since both the lens-attached LED 430 and the lens-free LED 435 emit light in the flash mode, both diffused and focused divergence angles 502 may be represented.

In the flash mode, the control module 500 may perform the flash mode according to the shutter speed of a camera (not shown) or by its own switch. When a flash signal is input, i.e., when the shutter of the camera or the switch operates, the lens-attached LED 430 and the lens-free LED 435 having about 10% brightness momentarily emits light with brightness equal to or greater than about 300 W, maximum power, and it is possible to keep emitting light for about 0.5 second to about 1 second after a signal input stops. When there is a need for an 1 second or longer operation after the signal input stops, it is possible to forcibly stop emitting light and enable the initial 10% brightness to be maintained.

Figure 12:
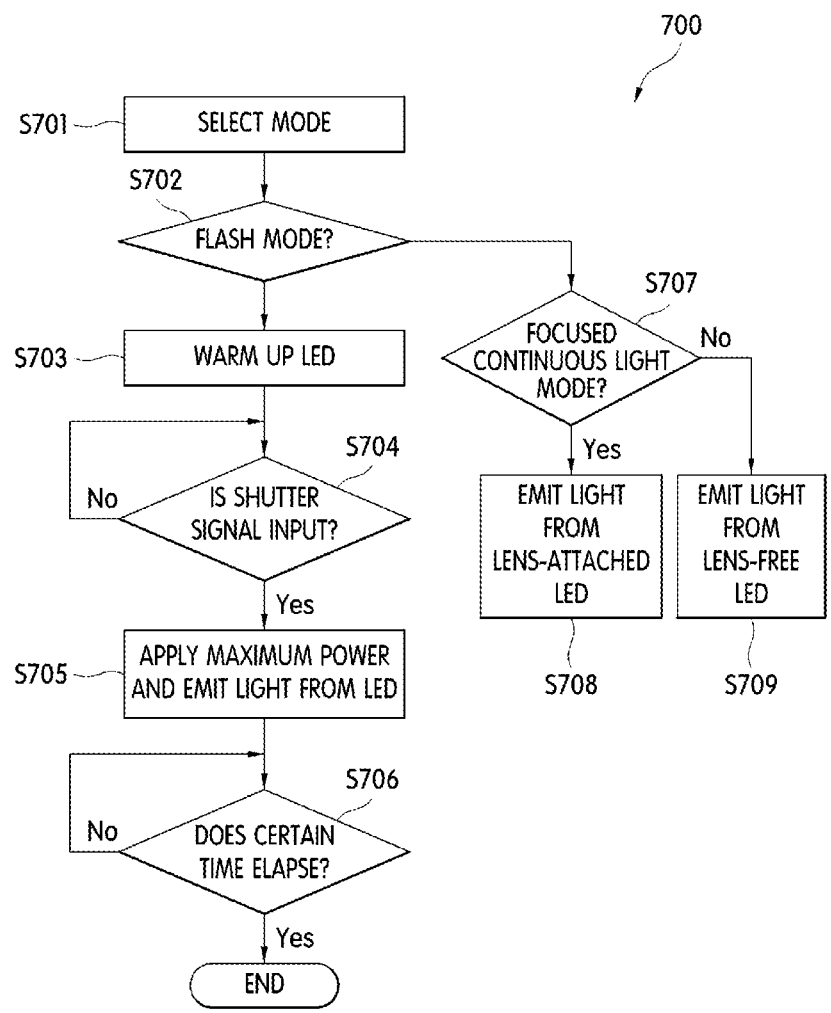
FIG. 12 is a flowchart for explaining the operation of an image-taking-purpose flexible LED lighting device according to another embodiment of the present invention.

In the following, the overall operation of the image-taking-purpose flexible LED lighting device according to another embodiment of the present invention is described in more detail with reference to FIG. 12. FIG. 12 is a flowchart for explaining the operation of an image-taking-purpose flexible LED lighting device according to another embodiment of the present invention.

As shown in FIG. 12, the operation method 700 in each mode of the image-taking-purpose flexible LED lighting device 10 includes selecting an operation mode through the control input unit 530 in step S701. In this case, it is determined whether the selected operation mode is a flash mode in step S720, and when the flash mode has been selected, the lens-attached LED 430 and the lens-free LED 435 are warmed up in step S703 when a camera shutter signal or the like is input. That is, the lens-attached LED 430 and the lens-free LED 435 emits light with brightness corresponding to about 10% of maximum power.

Next, it is determined whether the shutter of a camera operates in step S704, and when the shutter of a camera operates, the flash control circuit 524 applies maximum power to the lens-attached LED 430 and the lens-free LED 435 to enable the lens-attached LED 430 and the lens-free LED 435 to emit high-power light.

Next, it is determined whether a certain time elapses in step S706, and when the certain time elapses, e.g., when about 0.5 second to about 1 second elapses, the high-power light emission of the lens-attached LED 430 and the lens-free LED 435 may stop. In this case, the lens-attached LED 430 and the lens-free LED 435 may be maintained with about 10% brightness of a warm-up state.

When as a result of determination in step S702, it is determined that the operation mode is not the flash mode, it is determined whether the operation mode is a focused, continuous light mode in step S707, and when it is determined that the operation mode is the focused, continuous light mode, the lens-attached LED 430 emits light in step S708. That is, the continuous-light control circuit 522 applies constant currents corresponding to about 50% of maximum power to the lens-attached LED 430 so that the lens-attached LED 430 emits light with about 30% to about 40% brightness.

When as a result of determination in step S707, it is determined that the operation mode is not the focused, continuous light mode, i.e., when the operation mode is a diffused, continuous light mode, the lens-free LED 435 emits light in step S709. For example, the continuous-light control circuit 522 applies constant currents corresponding to about 50% of maximum power to the lens-free LED 435 so that the lens-free LED 435 emits light with about 30% to about 40% brightness.

Although the present embodiment describes that the flash mode and the continuous light mode selectively operates, it is possible to perform any one continuous mode, i.e., the focused, continuous light mode or the diffused, continuous light mode, and the flash mode together. For example, when the image-taking-purpose flexible LED lighting device 10 operates in the focused, continuous light mode, so the lens-attached LED 430 emits light, and then the shutter of a connected camera operates, the lens-attached LED 430 and the lens-free LED 435 emit high-power light together so that it is possible to achieve the flash mode. Similarly, when the image-taking-purpose flexible LED lighting device 10 operates in the diffused, continuous light mode, so the lens-free LED 435 emits light, and then the shutter of a connected camera operates, the lens-free LED 435 and the lens-attached LED 435 emit high-power light together so that it is possible to achieve the flash mode.

The image-taking-purpose flexible LED lighting device 10 configured in this way may be used in plurality, in which case they may be used as an indoor small studio or outdoor stage.

Figure 13A:
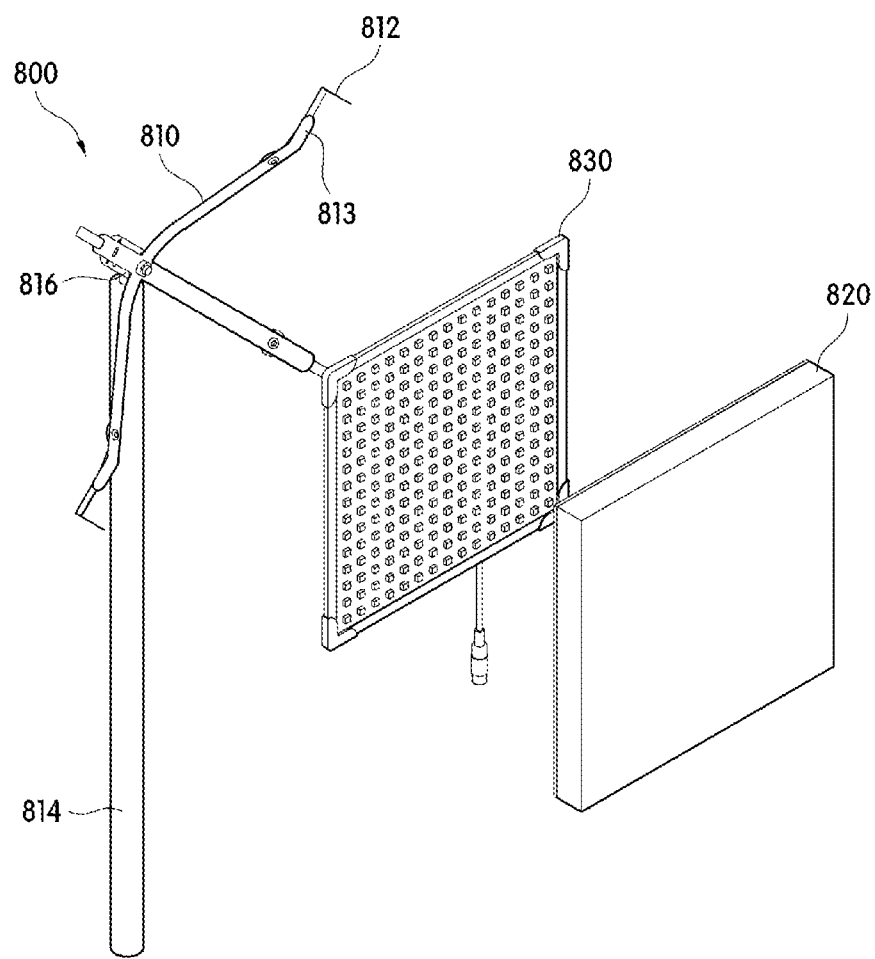
FIG. 13A is an exploded, perspective view of an image-taking-purpose flexible LED lighting device according to still another embodiment of the present invention.
Figure 13B:
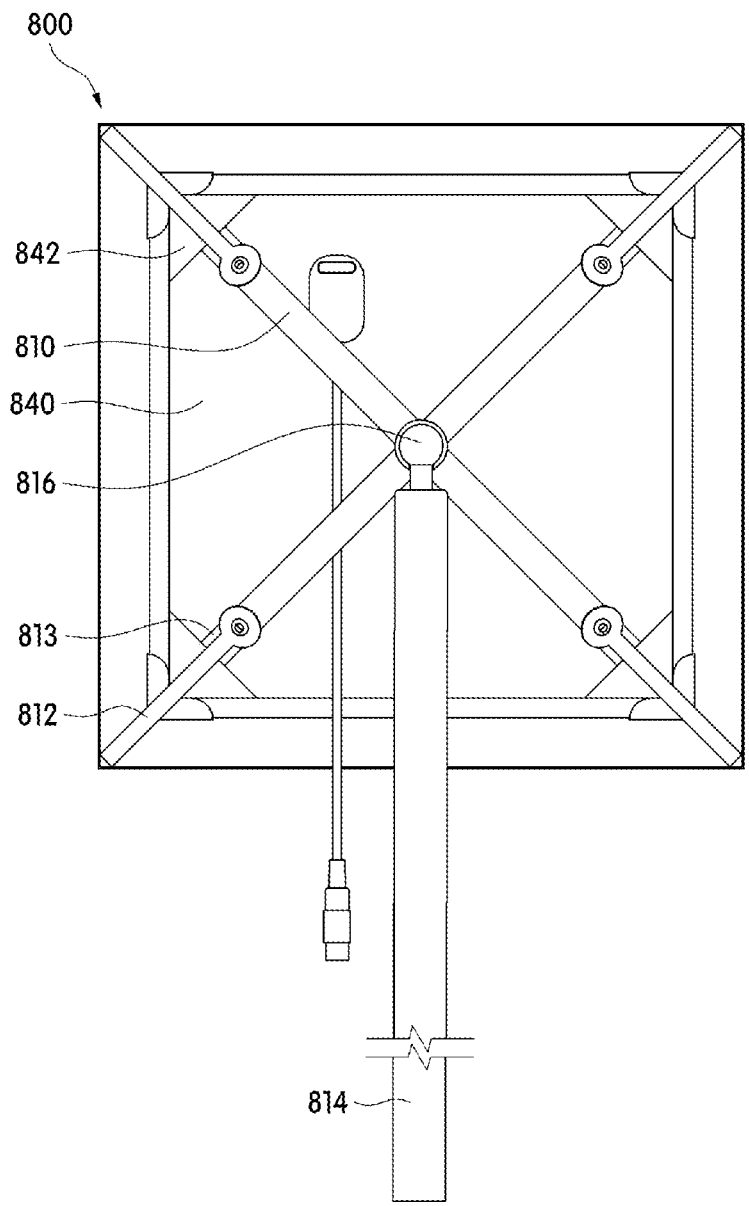
FIG. 13B is a rear view of the device.
Figure 13C:
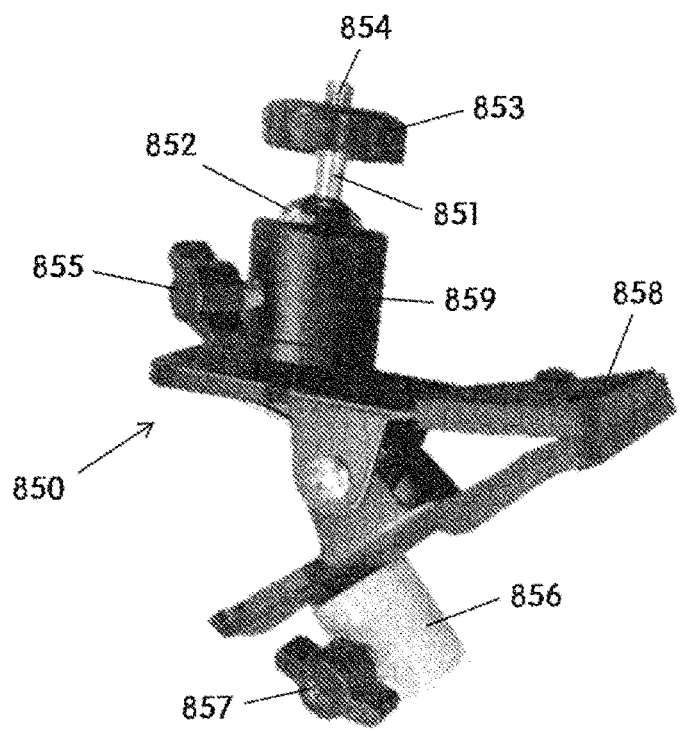
FIG. 13C is a perspective view of a coupling-purpose clip.

In the following, an image-taking-purpose flexible LED lighting device according to still another embodiment of the present invention is described with reference to FIGS. 13A to 13C. FIG. 13A is an exploded, perspective view of an image-taking-purpose flexible LED lighting device according to still another embodiment of the present invention, FIG. 13B is a rear view of the device, and FIG. 13C is a perspective view of a coupling-purpose clip.

An image-taking-purpose flexible LED lighting device 800 according to the present invention is obtained by adding a fixing support to the image-taking-purpose flexible LED lighting device 10 described with reference to FIGS. 8 to 12, and includes a rib 810, a diffuse plate 820, a flexible LED light source panel 830, a fixing plate 840, and a fixing clip 850. In this example, the fixing support includes the rib 810, a support 814, and a coupling portion 816.

The rib 810 has an upper-case letter X shape, and a first fixing portion 813 and a second fixing portion 812 may be formed at each end of the rib 810. The first fixing portion 813 is formed at each end of the rib 810 may be inserted into an insertion portion formed on the rear surface of the fixing plate 840 as will be described, the second fixing portion 812 is formed so that one side of the second fixing portion may rotate about one side of the fixing portion 813 at each end of the rib 810, the other side of the second fixing portion is formed to protrude outwards in an inversed L shape and may thus be disposed to protrude from each corner of the fixing plate 840 in order to fix the diffuse plate 820, in which case the second fixing portion 812 may be spaced at about 2 cm to about 3 cm apart from the flexible LED light source panel 830. The rib 810 may be formed of spring steel or plastic having high elasticity.

The support 814 supports the image-taking-purpose flexible LED lighting device 800 so that the device may stand up on the floor, and the support may have any shape which enables the support to be supported by the floor.

The coupling portion 816 couples the rib 810 and the support 814, and may be disposed, for example, on the rear surface of the center of the X-shaped rib 810, i.e., on the rear surface of the center where the first fixing portions 813 cross.

The diffuse plate 820 is formed to cover the front surface of the flexible LED light source panel 830 and may be disposed to be supported by the second fixing portion 812. While the diffuse plate 820 is coupled to the second fixing portion 812 having the inverse-L shape as described above, it may be maintained in a flat state by the elasticity of the second fixing portion 812.

The flexible LED light source panel 30 is the same as the flexible LED light source panel as shown in FIG. 9, and may include a flexible LED module obtained by alternately disposed a lens-attached LED and a lens-free LED on a flexible circuit board.

The fixing plate 840 is attached to the rear surface of the flexible LED light source panel 830, and the insertion portion 842 having a certain depth may be formed at each corner on the rear surface of the fixing plate so that the first fixing portion 813 of the rib 810 is inserted and fixed.

The fixing clip 850 may be coupled to the lower part of the rib 814 to be capable of being coupled to a desk or another support structure, and has coupling structures on the upper and lower parts of a clip body 858 having a tongs shape. That is, a ball head receiving portion 859 is formed on the upper part of the clip body 858, a pivotable ball head 852 is received in the ball head receiving portion 859, a connection portion 851 is integrally formed on the upper part of a ball head 852, and a rotatable adjusting portion 853 is formed along with the upper portion 854 of the connection portion 851. A fixing portion 855 for fixing the ball head 852 is formed on a lateral face of the ball head receiving portion 859, and the fixing portion 855 fixes the ball head 852 received in the ball head receiving portion 895 by screw rotation. An insertion connection portion 856 is formed on the lower part of the clip body 858, and a fixing portion 857 is formed on a later face of the insertion connection portion 856.

The fixing clip 850 configured in this way fixes the clip body 858 to the desk while the support 814 is connected to the upper portion 854 of the connection portion 851, so it is possible to use the image-taking-purpose flexible LED lighting device 800. In this example, the usage angle of the image-taking-purpose flexible LED lighting device 800 may be adjusted by the unlocking of the fixing portion 855 formed on the lateral face of the ball head receiving portion 859, the rotating of the ball head 852 at a desired angle, and then the locking of the fixing portion 855.

Optionally, while the fixing clip 580 is connected to the support 814, it is possible to use the image-taking-purpose flexible LED lighting device 800 by inserting another support into the insertion connection portion 856 and fixing it with the fixing portion 857, as described above.

Figure 14A:
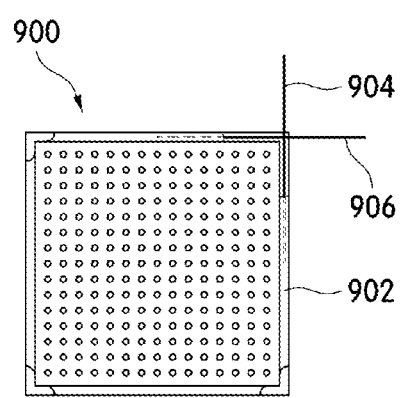
FIG. 14A is a diagram representing a flexible LED light source panel according to still another embodiment of the present invention.
Figure 14B:
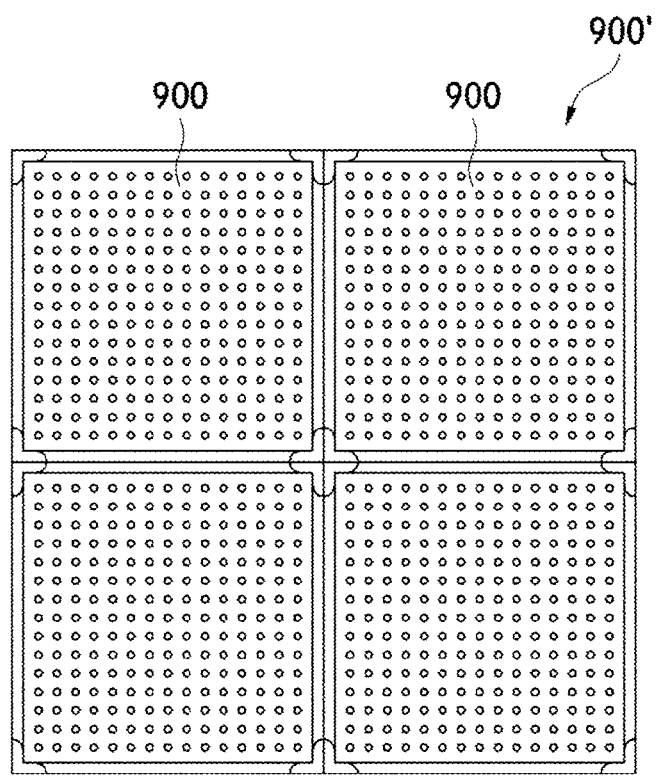
FIG. 14B is a diagram representing an example of a wide-area connection structure.

In the following, a flexible LED light source panel according to still another embodiment of the present invention with reference to FIG. 14. FIG. 14A is a diagram representing a flexible LED light source panel according to still another embodiment of the present invention, FIG. 14B is a diagram representing an example of a wide-area connection structure, FIG. 14C is a diagram representing another example of a wide-area connection structure, and FIG. 14D is a diagram representing an example of how a wide-area connection structure is implemented.

As shown in FIG. 14A, a flexible LED light source panel 900 may be configured so that wires 904 and 906 are inserted into a light source guide 902 disposed at the edge of the panel. For example, a wire is inserted into at least one of four sides corresponding to the light source guide 902, in which case the wires 904 and 906 may be metal wires easy to modify shapes. Thus, the flexible LED light source panel 900 may modify the shape of the light source guide 902 by bending it to have a desired shape and in this case, it is possible to maintain a modified shape by the wire inserted into the light source guide 902.

Since flexible LED light source panels are manufactured to have limited areas according to the size of a flexible circuit board, it is possible to expand them to a wide area. As shown in FIG. 14B, it is possible to manufacture a wide-area flexible LED light source panel 900 by combining a plurality of flexible LED light source panels after the manufacturing of the plurality of flexible LED light source panels.

Figure 14C:
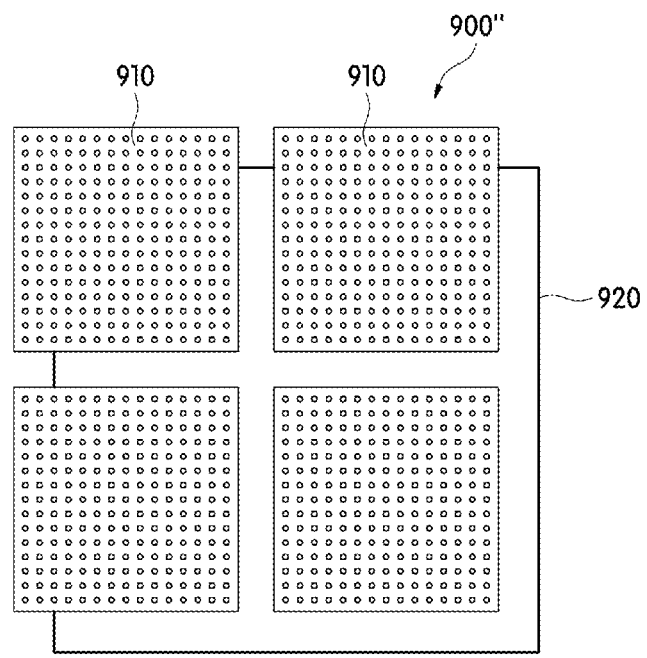
FIG. 14C is a diagram representing another example of a wide-area connection structure.
Figure 14D:
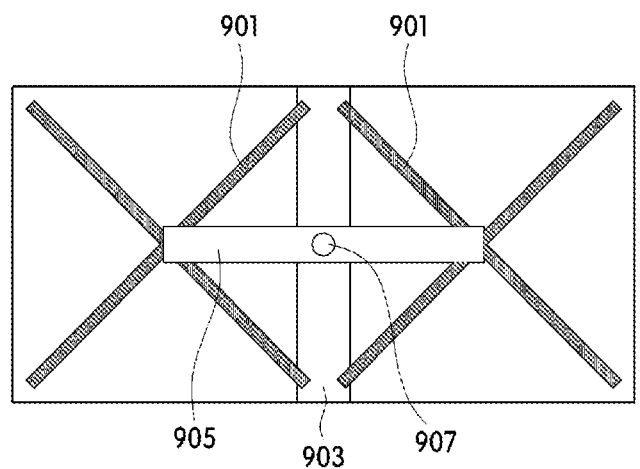
FIG. 14D is a diagram representing an example of how a wide-area connection structure is implemented.

Alternatively, it is possible to manufacture a wide-area flexible LED light source panel 900" by attaching a plurality of flexible LED light source modules 910 after the manufacturing of the flexible LED light source module 910, as shown in FIG. 14C. In this case, since there is no redundant light source guide, it is possible to manufacture a light source panel more similar to a single light source panel in comparison to FIG. 14B.

When a wide-area flexible LED light source panel is manufactured by using a plurality of flexible LED light source panels 900 or a plurality of flexible light source modules 910 in this way, each component may be coupled by using a simple structure. For example, the flexible LED light source panels disposed side by side may be connected through a Velcro tape 903 and an X-shaped band 901 is disposed on the rear surface of each panel. Also, each x-shaped band 901 may be connected through a guide 903 and fixed by an adjusting portion 907.

Figure 15A:
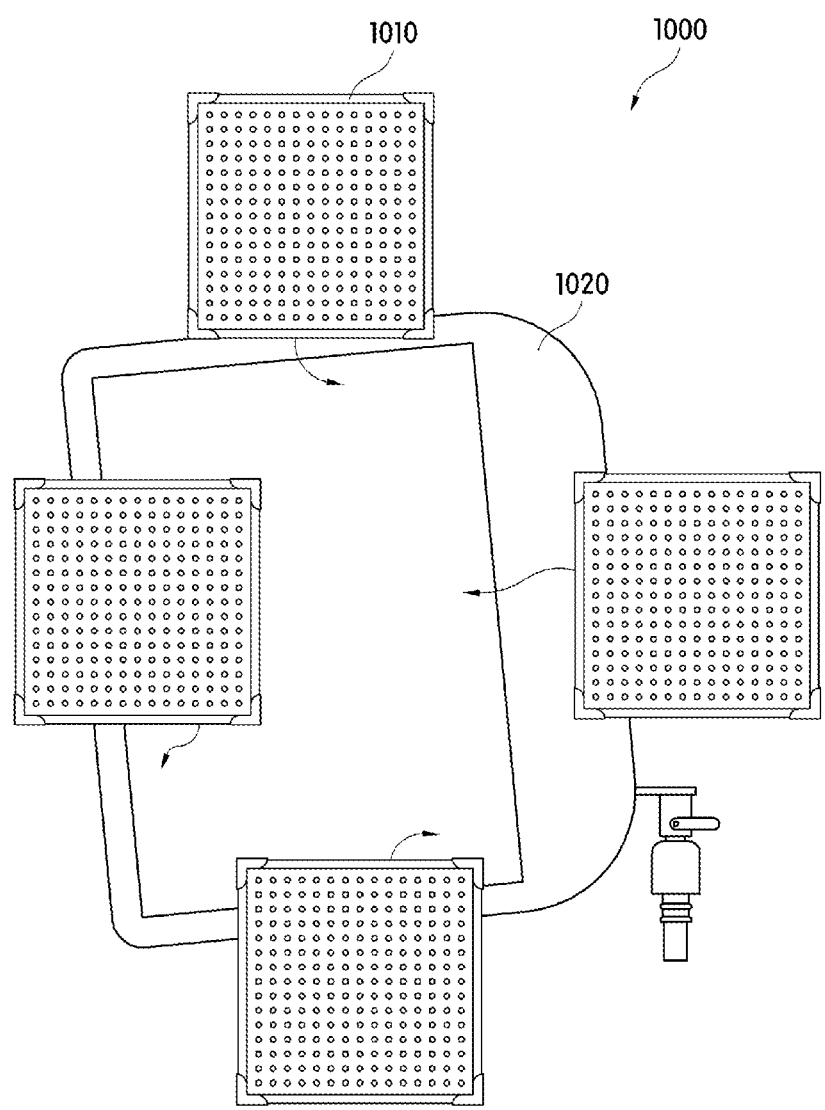
Figure 15B:
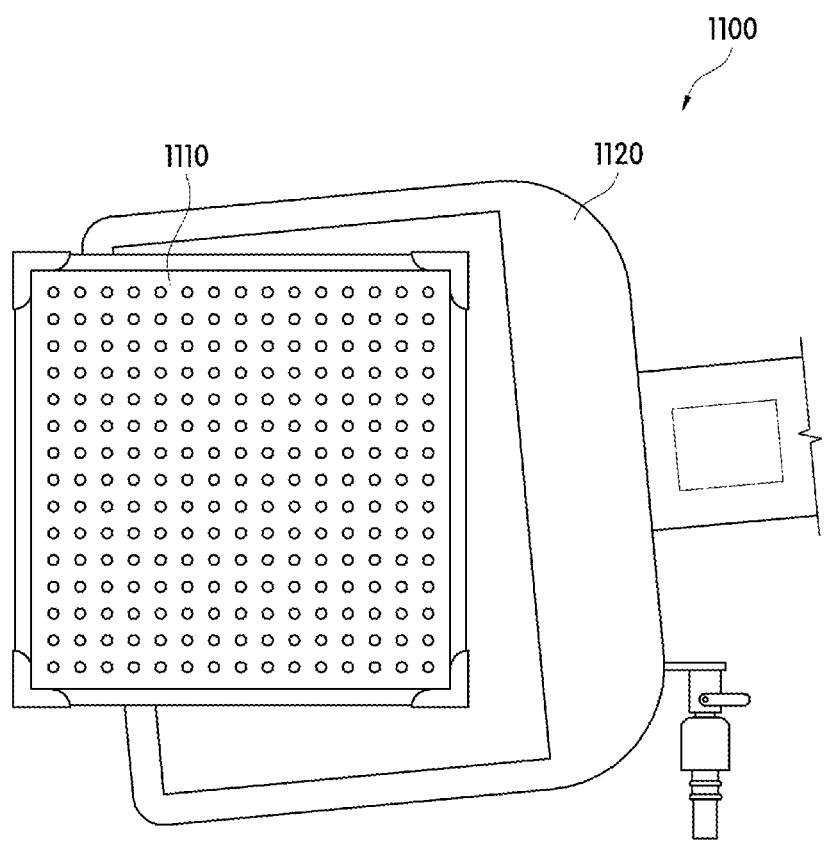

In the following, an image-taking-purpose flexible LED lighting device according to still another embodiment of the present invention is described with reference to FIGS. 15A to 115B. FIGS. 15A and 15B represent another example of an image-taking-purpose flexible LED lighting device according to a still another embodiment of the present invention, among which FIG. 15A is an example where a plurality of flexible LED light source panels is included in a soft box, and FIG. 15B is a perspective view of an example where a single flexible LED light source panel is included in the soft box.

The image-taking-purpose flexible LED lighting device 1000 according to the embodiment in FIG. 15A is obtained by installing the image-taking-purpose flexible LED lighting device 10 described with reference to FIGS. 8 to 12 in a soft box 1020 and includes a plurality of flexible LED light source panels 1010 and the soft box 1020. In this case, the rear surface of the flexible LED light source panel 1010 may be attached to the soft box 1020 through a speed ring (not shown).

The image-taking-purpose flexible LED lighting device 1100 according to the embodiment in FIG. 15B uses only a single flexible LED light source panel 1100, and the single flexible LED light source panel 1100 may be attached to a soft box 1120 through a speed ring (not shown).

Since the flexible LED light source panels 1000 and 1100 are attached to the soft boxes 1020 and 1120 as shown in FIGS. 15A and 15B and thus the soft boxes themselves may be used as light sources, a separate lighting device may not need.

Figure 16:
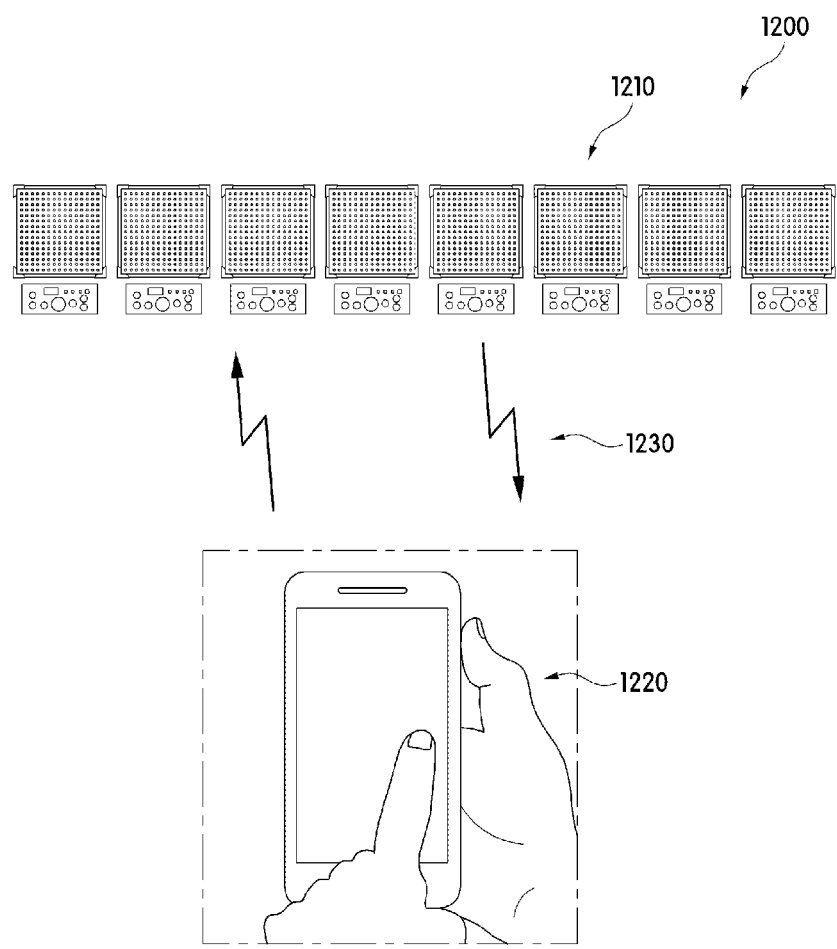
FIG. 16 is a diagram representing the schematic configuration of an image-taking-purpose flexible LED lighting device according to still another embodiment of the present invention.
Figure 17:
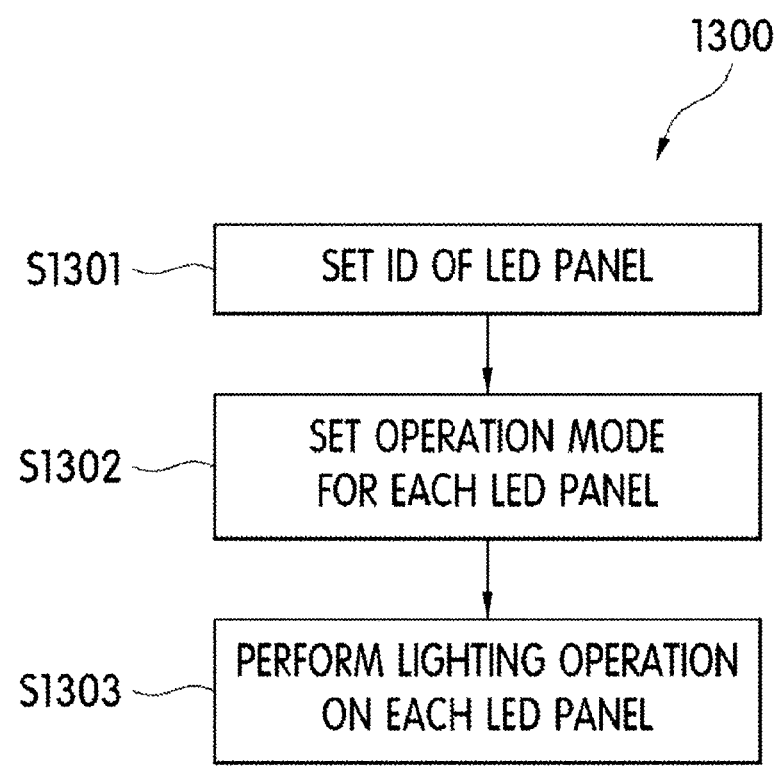
FIG. 17 is a flowchart for explaining the operation of an external device in FIG. 16.

FIG. 16 is a diagram representing the schematic configuration of an image-taking-purpose flexible LED lighting device according to still another embodiment of the present invention, and FIG. 17 is a flowchart for explaining the operation of an external device in FIG. 16.

An image-taking-purpose flexible LED lighting device 1200 in the present embodiment may use a plurality of image-taking-purpose flexible LED lighting device 10 in FIG. 8 that may be remotely controlled by an external device through a control module, in which case the control module may include a communication unit communicating with the external device. For example, the communication unit may perform communication by using any one of communication standards wireless WiFi, Bluetooth, and Zigbee, and the external device may be a mobile phone or a mobile communication terminal, such as a smart phone.

As shown in FIG. 17, a remote control method 1300 using the external device may first set identification (ID) for a flexible LED light source panel or an image-taking-purpose flexible LED lighting device 1210 in step S1301. In this case, the ID may be set by an individual control module of the image-taking-purpose flexible LED lighting device 1210 but alternatively, it may be set by the external device 1220. That is, an application capable of performing the method according to the present embodiment may be installed in the external device 1220, and it is possible to set the ID for each image-taking-purpose flexible LED lighting device 1210 by the setting menu of the application.

Next, it is possible to set an operation mode for each flexible LED light source panel or an image-taking-purpose flexible LED lighting device 1210 in step S1302. For example, it is possible to set any one of e.g., focused continuous light, diffused continuous light, and flash light modes for each image-taking-purpose flexible LED lighting device 1210 to which the ID has been allocated by the external device 1220.

Next, a lighting function is performed according to the operation mode set for each flexible LED light source panel image-taking-purpose flexible LED lighting device 1210 in step S1303. That is, each flexible LED light source panel or image-taking-purpose flexible LED lighting device 1210 may emit light at least one of a lens-attached LED or a lens-free LED, according to a preset operation mode.

Although FIG. 17 shows that the image-taking-purpose flexible LED lighting device 1210 includes each control module, the present invention is not limited thereto and the lighting device may include each flexible LED light source panel and a single control module, in which case the single control module may set the ID and operation mode of each flexible LED light source panel.

By such a configuration, the image-taking-purpose flexible LED lighting device according to the embodiments of the present invention may provide various functions, such as focused continuous light, diffused continuous light and flash according to the use to achieve a multi-purpose lighting device, and since the lighting device has a decreased decreases by using a heat radiation sheet made of a special material and has flexibility by using a flexible substrate, storage capability and mobility are enhanced and thus there may be no constraints on the place where the lighting device is used.

Also, the image-taking-purpose flexible LED lighting device according to an embodiment of the present invention is configured to enable different LEDs to operate according to the use so that it is possible to provide various functions, such as focused continuous light, diffused continuous light, and flash according to the use to achieve a multi-purpose lighting device.

Although embodiments of the present invention have been described above, the spirit of the present invention is not limited to the embodiments presented herein and a person skilled in the art may easily propose another embodiment by the addition, change or deletion of a component within the scope equivalent to that of the spirit of the present invention and the another embodiment may also fall within the scope of the spirit of the present invention.

What is claimed is:

1. A flexible LED light source panel comprising:
    a flexible LED module in which a plurality of LEDs is disposed in an array form on a flexible circuit board;
    a protective sheet stacked on the flexible LED module and diffusing light from the LEDs;
    a heat conduction sheet disposed under the flexible LED module;
    a heat radiation sheet disposed under the heat conduction sheet, made of fireproof fiber, and coated with a carbon nano tube molecule having a grid or vertical structure; and
    a light source guide having a quadrilateral shape.

2. The flexible LED light source panel of claim 1, wherein the protective sheet has a protrusion portion to correspond to a location and shape of the LED.

3. The flexible LED light source panel of claim 1, wherein the flexible circuit board has a heat radiation pad for transferring heat.

4. The flexible LED light source panel of claim 1, wherein the flexible circuit board has a circuit pattern to enable each of the LEDs to be connected to have a crossing structure.

5. The flexible LED light source panel of claim 1, wherein the heat radiation sheet comprises fiber obtained by adding flame retardant to polyester fiber, further comprises adhesive silicon obtained by mixing a carbon nano molecule in any one direction of the fireproof fiber, and is obtained by disposing the fireproof fiber in a two-stage structure, and an air path is formed between the fireproof fibers.

6. The flexible LED light source panel of claim 1, wherein a through hole is formed at a portion of the flexible circuit board on which the LED is disposed, and the LED is disposed on the through hole through heat conduction silicon.

7. An image-taking-purpose flexible LED lighting device comprising:
    a flexible LED module obtained by alternately arranging a lens-attached LED and a lens-free LED on a flexible circuit board,
    a protective sheet stacked on the flexible LED module and diffusing light from the lens-attached LED and the lens-free LED,
    a heat conduction sheet disposed under the flexible LED module,
    a heat radiation sheet disposed under the heat conduction sheet and comprising fireproof fiber, and
    a flexible LED light source panel comprising a light source guide having a quadrilateral shape; and
    a control module enabling at least one of the lens-attached LED and the lens-free LED to selectively emit light according to any one of flash, focused continuous light, and diffused continuous light modes.

8. The image-taking-purpose flexible LED lighting device of claim 7, wherein the flexible circuit board has a heat radiation pad for transferring heat and has a through hole on a portion thereof on which the LED is disposed, and the LED is disposed on the through hole through heat conduction silicon.

9. The image-taking-purpose flexible LED lighting device of claim 7, wherein the flexible circuit board has a circuit pattern to enable each of the LEDs to be connected to have a crossing structure.

10. The image-taking-purpose flexible LED lighting device of claim 7, wherein the heat radiation sheet comprises fiber obtained by adding flame retardant to polyester fiber, further comprises adhesive silicon obtained by mixing a carbon nano molecule in any one direction of the fireproof fiber, and is obtained by disposing the fireproof fiber in a two-stage structure, and an air path is formed between the fireproof fibers.

11. The image-taking-purpose flexible LED lighting device of claim 7, wherein the control module enables the lens-attached LED to emit light according to the focused continuous light mode, enables the lens-free LED to emit light according to the diffused continuous light mode, and enables both the lens-attached LED and the lens-free LED to emit light according to the flash mode.

12. The image-taking-purpose flexible LED lighting device of claim 11, wherein the control module enables the flexible LED module to cooperate with a camera shutter according to the flash mode, enables the lens-free LED and the lens-attached LED to warm up to a state in which light is emitted with brightness equal or lower than about 10% of maximum brightness and then emit light, when there is an input signal from the camera shutter, and enables a light emission state to be maintained for a certain time after an operation of the shutter has been completed.

13. The image-taking-purpose flexible LED lighting device of claim 7, wherein the lens-attached LED is configured to have different divergence angles at the center and edge of the flexible circuit board.

14. The image-taking-purpose flexible LED lighting device of claim 7, wherein the heat radiation sheet is obtained by injecting of a carbon nano tube molecule having a grid or vertical structure onto a top surface of the sheet.

15. The image-taking-purpose flexible LED lighting device of claim 7, wherein the control module further comprises a communication unit communicating with an external device to be controlled remotely by the external device.

16. The image-taking-purpose flexible LED lighting device of claim 15, wherein the external device comprises a mobile communication terminal, and the external device communicating with the communication unit performs communication by using any one of communication standards comprising wireless WiFi, Bluetooth, and Zigbee.

17. The image-taking-purpose flexible LED lighting device of claim 7, further comprising:
   a fixing plate attached to a rear surface of the flexible LED light source panel and having an insertion portion having a certain depth at each corner on a rear surface;
   a fixing support comprising:
   a rib having an X shape,
   a first fixing portion formed at each end of the rib and inserted and fixed into the insertion portion, and
   a second fixing portion formed to be pivotable about a side of the first fixing portion at each end of the rib, and disposed to protrude from each corner of the fixing plate; and
   a diffuse plate formed to cover a front surface of the flexible LED light source panel and disposed to be supported by the second fixing portion.

18. The image-taking-purpose flexible LED lighting device of claim 17, wherein the rib comprises spring steel or plastic having excellent elasticity.

19. The image-taking-purpose flexible LED lighting device of claim 17, further comprising a fixing clip having a tongs shape and coupled to the rib.

20. The image-taking-purpose flexible LED lighting device of claim 7, wherein the light source guide comprises a variable wire in at least one of four sides.

21. The image-taking-purpose flexible LED lighting device of claim 7, further comprising a soft box attached to the rear surface of the flexible LED light source panel through a speed ring.

* * * * *